(12) United States Patent
Hayashida et al.

(10) Patent No.: US 8,115,908 B2
(45) Date of Patent: Feb. 14, 2012

(54) POSITION MEASURING DEVICE AND POSITION MEASURING METHOD IN SEMICONDUCTOR SINGLE CRYSTAL MANUFACTURING DEVICE

(75) Inventors: Toshio Hayashida, Omura (JP); Ayumi Kihara, Omura (JP); Naoji Mitani, Omura (JP)

(73) Assignee: Sumco Techxiv Corporation, Omura-shi (JP)

( * ) Notice: Subject to any disclaimer, the term of this patent is extended or adjusted under 35 U.S.C. 154(b) by 156 days.

(21) Appl. No.: 12/676,431

(22) PCT Filed: Aug. 25, 2008

(86) PCT No.: PCT/JP2008/065072
§ 371 (c)(1),
(2), (4) Date: Mar. 4, 2010

(87) PCT Pub. No.: WO2009/034825
PCT Pub. Date: Mar. 19, 2009

(65) Prior Publication Data
US 2010/0165321 A1    Jul. 1, 2010

(30) Foreign Application Priority Data
Sep. 12, 2007    (JP) ................................. 2007-236952

(51) Int. Cl.
*G01C 3/08*    (2006.01)
(52) U.S. Cl. ...... 356/3.09; 356/3.01; 356/3.1; 356/3.15; 356/4.01
(58) Field of Classification Search ........ 356/3.01–3.15, 356/4.01–4.1, 5.01–5.15, 6–22, 28, 28.5, 356/139.01–139.1
See application file for complete search history.

(56) References Cited

U.S. PATENT DOCUMENTS
2003/0116729 A1*  6/2003  Moriya et al. ................ 250/577
2007/0017435 A1*  1/2007  Takanashi ....................... 117/14

FOREIGN PATENT DOCUMENTS
JP    2000-264779         9/2000
JP    2007-223879 A1      9/2007
WO    WO 01/83859 A1      11/2001

OTHER PUBLICATIONS
International Search Report for International Application No. PCT/JP2008/065072 dated Sep. 5, 2008.

* cited by examiner

*Primary Examiner* — Thomas Tarcza
*Assistant Examiner* — Luke Ratcliffe
(74) *Attorney, Agent, or Firm* — Kratz, Quintos & Hanson, LLP

(57) ABSTRACT

While position measurement of an edge position of a thermal shield takes place in a short time with high working efficiency, the edge position can be measured accurately without variation. First determination takes place while a distance is measured with a first scanning interval. When a change in a measured distance which can be determined as the edge position is determined as a result, an optical scanning position is returned by a predetermined amount reversely to the scanning direction (or reversely to the scanning direction), and while laser beam is scanned again from the returned optical scanning position, second determination takes place while measuring the distance with a second scanning interval shorter than the first scanning interval. If a change in the measured distance which can be determined as the edge position is determined as a result, the laser beam is determined finally to be reflected at an edge of a rim of the thermal shield at the optical scanning position at a time point when the change is determined.

8 Claims, 10 Drawing Sheets

SCHEMATIC DIAGRAM OF SILICON SINGLE CRYSTAL MANUFACTURING DEVICE

SCHEMATIC DIAGRAM OF SILICON SINGLE CRYSTAL MANUFACTURING DEVICE

CONVENTIONAL ART

EMBODIMENT

POSITION MEASURING DEVICE AND POSITION MEASURING METHOD IN SEMICONDUCTOR SINGLE CRYSTAL MANUFACTURING DEVICE

TECHNICAL FIELD

The present invention relates to a position measuring device and a position measuring method in a semiconductor single crystal manufacturing device, and in particular relates to a position measuring device and a position measuring method applied to a semiconductor single crystal manufacturing device for manufacturing a semiconductor single crystal while measuring a distance between a thermal shield and a melt or/and a liquid level of the melt and performing control so that the measurement becomes a desired value.

BACKGROUND ART

A silicon single crystal is manufactured by being pulled up and grown based on CZ (Czochralski method).

FIG. 1 shows a configuration example of a silicon single crystal manufacturing device 1.

A CZ furnace 2 is internally provided with a quartz crucible 3 for melting a polycrystalline silicon raw material and housing it as a melt 5.

Polycrystalline silicon (Si) is heated and melted in the quartz crucible 3. When the temperature of the melt 5 is stabilized, a pulling mechanism 4 is operated and the silicon single crystal 10 is pulled up from the melt 5.

During the pulling, the quartz crucible 3 is rotated with a rotational axis 15. The rotational axis 15 can be driven in the vertical direction, and is able to move the quartz crucible 3 vertically to an arbitrary crucible position, and thereby adjust a surface 5a of the melt 5, namely, the liquid level H of the melt 5.

Moreover, a thermal shield 8 (heat radiation plate, gas straightening tube) is provided above the melt 5 and around the silicon single crystal 10. A rim 8a is provided to the lower end of the thermal shield 8.

The thermal shield 8 guides, within the CZ furnace 2, argon gas 7 as the carrier gas to be supplied from the upper side to the center of the melt surface 5a, and further guides it to the peripheral edge of the melt surface 5a by passing it through the melt surface 5a. The argon gas 7 is thereafter discharged from an outlet provided to the lower part of the CZ furnace 2 together with the gas that evaporated from the melt 5. Consequently, it is possible to stabilize the gas flow rate on the liquid level and maintain the oxygen that evaporated from the melt 5 in a stable state.

Moreover, the thermal shield 8 insulates and shields a seed crystal 14 and the silicon single crystal 10 grown from the seed crystal 14 from the heat radiation generated in the hot areas such as the quartz crucible 3, the melt 5, and a heater 9. The thermal shield 8 also prevents impurities (for instance, silicon oxide) generated in the furnace from adhering to the silicon single crystal 10 and inhibiting the single crystal growth.

The size of the distance L between the rim 8a at the lower end of the thermal shield 8 and the melt surface 5a (hereinafter referred to as the "thermal shield/liquid level distance") can be adjusted by lifting and lowering the rotational axis 15 and changing the vertical position of the quartz crucible 3. The distance L can also be adjusted by moving the thermal shield 8 in a vertical direction using a lifting and lowering device.

Quality of the silicon single crystal 10 is conventionally known to fluctuate in accordance with the size of the melt liquid level H or the thermal shield/liquid level distance L during the pulling. Specifically, if the size of the melt liquid level H or the thermal shield/liquid level distance L changes during the pulling, parameters such as the temperature gradient in the axial direction of the silicon single crystal 10 consequently fluctuate, thereby causing the defect region distribution and oxygen concentration distribution of the silicon single crystal 10 to change, whereby the quality of the crystal also change.

Thus, in order to obtain the crystal quality of the demanded specification, pulling conditions, that is, the target value of the melt liquid level H for each pulling position or the target value of the thermal shield/liquid level distance L for each pulling position is predetermined according to the demanded specification. During the pulling and growing process, the actual values of the melt liquid level H or the actual values of the thermal shield/liquid level distance L are sequentially detected, these detected values are fed back, and control is performed to adjust the vertical position of the rotational axis 15 so that the deviation of the target value and the detected value becomes zero.

Accordingly, in order to stably obtain a crystal quality of the demanded specification, the melt liquid level H or the thermal shield/liquid level distance L must be controlled to accurately coincide with the target value. In order to realize the above, the actual value of the melt liquid level H or the actual value of the thermal shield/liquid level distance L as the feedback amount to be detected during the control must constantly be measured with accuracy.

FIG. 2 shows a configuration example of the distance measuring device for measuring the actual value of the melt liquid level H or the thermal shield/liquid level distance L for each pulling position.

The distance measuring device 100 of FIG. 2 is configured by including light emitting means 110 for emitting a laser beam 101, light scanning means 120 for scanning the laser beam 101 that is emitted from the light emitting means 110 along the radial direction of the quartz crucible 3, light receiving means 130 for receiving the reflected light of the laser beam 101 that is emitted from the light emitting means 110 and used to perform scanning of the light scanning means 120, and pulling distance measuring means 141 for measuring the thermal shield/liquid level distance L or/and the melt liquid level H based on the fixed scanning position during the pulling, the laser beam emitting position of the light emitting means 110 and the light receiving position of the light receiving means 130, and according to the principle of triangulation.

The light scanning means 120 is configured by including a mirror 121 for reflecting the laser beam 101 that is emitted from the light emitting means 110, and a stepping motor 122 for changing the attitude angle of a light reflecting surface 121a of the mirror 121.

Here, the rotation angle θ of the rotational axis 122a of the stepping motor 122 and the scanning position of the laser beam 101 in the radial direction of the crucible 3 correspond one-to-one. Thus, in this specification, the scanning position of the laser beam 101 in the crucible radial direction is represented as θ.

Patent Document 1 discloses a method of measuring the actual value of the melt liquid level H or the actual value of the thermal shield/liquid level distance L as follows.

Specifically, foremost, the stepping motor 122 is driven to position the optical scanning position θ at the pulling position θ1. Subsequently, the laser beam 101 is emitted from the light emitting means 110 and irradiated onto the melt level 5a, and the laser beam that reflects off the melt level 5a is received by the light receiving means 130. Subsequently, the distance LS from the reference point to the liquid level 5a of the melt 5 is sought and the melt liquid level H is measured based on the fixed scanning position θ1 during the pulling, the emitting position of the light emitting means 110, and the light receiving position of the light receiving means 130, and according to the principle of triangulation.

Subsequently, the stepping motor 122 is driven to position the optical scanning position θ at the pulling position θ2. Subsequently, the laser beam 101 is emitted from the light emitting means 110 and irradiated onto the upper surface 8b of the rim 8a of the thermal shield 8, and the laser beam that reflects off the rim upper surface 8b is received by the light receiving means 130. Subsequently, the distance S from the reference point to the upper surface 8b of the rim 8a of the thermal shield 8 is measured based on the fixed scanning position θ2 during the pulling, the emitting position of the light emitting means 110, and the light receiving position of the light receiving means 130, and according to the principle of triangulation. The thermal shield/liquid level distance L is calculated based on the obtained distance LS up to the liquid level 5a of the melt 5, the distance S up to the upper surface 8b of the rim 8a of the thermal shield 8, and the thickness t of the rim 8a of the thermal shield 8.

Moreover, Patent Document 2 discloses a method of measuring the actual value of the melt liquid level H and the actual value of the thermal shield/liquid level distance L as follows.

Specifically, as shown in FIG. 3, foremost, the stepping motor 122 is driven to position the optical scanning position θ at the pulling position θ3. Subsequently, the laser beam 101 is emitted from the light emitting means 110 to be reflected off the melt level 5a, the laser beam that reflects off the melt level 5a is irradiated onto the lower surface 8c of the rim 8a of the thermal shield 8, the laser beam that reflects off the rim lower surface 8c is irradiated onto the melt level 5a once again, and the laser beam that reflects off the melt level 5a is received by the light receiving means 130. Subsequently, the distance LS from the reference point to the liquid level 5a of the melt 5 is sought and the melt liquid level H is measured based on the fixed scanning position θ3 during the pulling, the emitting position of the light emitting means 110, and the light receiving position of the light receiving means 130, and according to the principle of triangulation.

Subsequently, the stepping motor 122 is driven to position the optical scanning position θ at the pulling position θ4. Subsequently, the laser beam 101 is emitted from the light emitting means 110 and irradiated onto the upper surface 8b of the rim 8a of the thermal shield 8, and the laser beam that reflects off the rim upper surface 8b is received by the light receiving means 130. Subsequently, the distance S from the reference point to the upper surface 8b of the rim 8a of the thermal shield 8 is measured based on the fixed scanning position θ4 during the pulling, the emitting position of the light emitting means 110, and the light receiving position of the light receiving means 130, and according to the principle of triangulation. The thermal shield/liquid level distance L is calculated based on the thus obtained distance LS up to the liquid level 5a of the melt 5, the distance S up to the upper surface 8b of the rim 8a of the thermal shield 8, and the thickness t of the rim 8a of the thermal shield 8.

The foregoing optical scanning positions θ1, θ2, θ3, θ4 during the pulling are defined based on the reference optical scanning position θc. The reference optical scanning position θc is the edge 8e of the rim 8a of the thermal shield 8.

Patent Document 2 discloses the position measuring algorithm for measuring the optical scanning position θc of the edge 8e of the rim 8a of the thermal shield 8. This position measuring principle is explained with reference to FIG. 4. This position measuring algorithm is performed, for instance, between the respective batches, during the disassembly or cleaning of the CZ furnace 2, or midway during the pulling process.

Specifically, foremost, the distance between the reference point and the reflection point is sequentially measured for each prescribed interval Δθ1 based on the sequential optical scanning position, the emitting position of the light emitting means 110, and the light receiving position of the light receiving means 130, and according to the principle of triangulation while scanning the laser beam 101 by the light scanning means 120 in the radial direction of the crucible 3.

Subsequently, it is determined whether the measured distance changes from a size corresponding to the distance between the reference point and the melt 5 to a size corresponding to the distance between the reference point and the rim 8a of the thermal shield 8.

If it is consequently determined that the measured distance changes, it is determined that the laser beam 101 is reflected off the edge 8e of the rim 8a of the thermal shield 8 at the optical scanning position θc at the point in time that the change is determined.

As described above, the positions θ1, θ2, θ3, θ4 of the direction for scanning the laser beam 101 during the pulling are defined as reference based on the optical scanning position θc when it is determined that the laser beam 101 reflected off the edge 8e of the rim 8a of the thermal shield 8.

Patent Document 1: Japanese Patent Application Laid-Open No. 2000-264779

Patent Document 2: WO01/083859

DISCLOSURE OF THE INVENTION

Problems to be Solved by the Invention

Nevertheless, the foregoing conventional position measuring algorithm is unable to accurately seek the position θc of the edge 8e of the rim 8a of the thermal shield 8, and there is a problem that the measured position varies. This point is now explained with reference to FIG. 5A and FIG. 5B.

As a result of intense study, the present inventors are speculating that there are two reasons why it is not possible to accurately seek the position θc of the edge 8e of the rim 8a of the thermal shield 8, and why the measured position varies.

Specifically, one reason is that, when scanning the laser beam 101 in the crucible radial direction, noise is generated in the detection output of the light receiving means 130 when the irradiation point of the laser beam moves from the melt surface 5a to the thermal shield 8, and the distinction of the movement, that is, the distinction that the irradiation point of the laser beam 101 arrived at the edge 8e is difficult. Noise as used herein refers to the ghost (stray light) caused by the scattered light other than the melt mirror reflection.

Another reasons is that, since the position measuring algorithm performs the position measurement operation with high efficiency, the optical scanning is performed at high speed by driving the stepping motor 122 at high speed, and the distance measurement is performed at an interval of a relatively long cycle Δθ1 (FIG. 5A). Thus, at the point in time that it is determined to be the edge position, in many cases the irradiation point of the laser beam 101 already deviates from the edge 8e and moved to the back of the upper surface 8b of the rim 8a. Consequently, the edge position is often erroneously measured as the position θb of the upper surface 8*b* of the rim 8*a*. Thus, the edge position varies in the range Δθ beyond the edge 8*e* as shown in FIG. 5B.

If the measured edge position θc varies in the range of Δθ, the fixed scanning positions θ1, θ2, θ3, θ4 during the measurement conducted by defining the edge position θc as the reference also vary.

Here, the upper surface 8*b* of the rim 8*a* of the thermal shield 8 is never flat, and the irregularity differs and the height differs by location.

Thus, if the edge measured position varies for each batch, the distance S from the reference point to the upper surface 8*b* of the rim 8*a* of the thermal shield 8 also varies.

FIG. 6A is experimental data showing that the measurement S varies in each batch. In the experiment, the edge position is measured for each batch, the optical scanning positions θ2, θ4 based on the edge position were rewritten for each batch, and the laser beam 101 is emitted by fixing the positions to the rewritten optical scanning positions θ2, θ4 to measure the S value for each batch. The horizontal axis of the histogram is the deviation from the average value of the S measurement, and the average value is set to 0. Meanwhile, the vertical axis shows the frequency. As shown in FIG. 6A, conventionally, the distance S value varied within the range of ±3 mm of the average value.

When the S measurement varies as described above, the measurement of the thermal shield/liquid level distance L consequently varies, and it is difficult to stably control the pulling and growth of the silicon single crystal upon feeding back the actual position of the thermal shield/liquid level distance L. Consequently, the quality of the pulled and grown silicon single crystal 10 may vary, and it may become difficult to provide a product of stable specification.

Moreover, if the edge position θc cannot be accurately sought, it becomes difficult to accurately irradiate the laser beam 101 onto the target position of the upper surface 8*b* of the rim 8*a* of the thermal shield 8 upon defining the irradiation direction of the laser beam 101 based on the edge position θc, and it becomes difficult to irradiate the laser beam 101 onto the target position of the melt surface 5*a*. Consequently, it may become difficult to perform the distance measurement shown in FIG. 2 or to perform the distance measurement shown in FIG. 3. In particular, if the distance D between the thermal shield 8 and the silicon single crystal 10 is narrow, or if the length of the crucible radial direction of the upper surface 8*b* of the rim 8*a* of the thermal shield 8 is short, it becomes even more difficult.

As described above, there are demands for measuring the edge position θc of the thermal shield 8 accurately and without variation. In addition, it is necessary to complete the position measurement processing in a short period of time in order to increase the operation efficiency since control cannot be performed while the position measurement is being conducted.

DISCLOSURE OF THE INVENTION

The present invention is made in view of the foregoing circumstances, and an object thereof is to measure the edge position θc accurately without variation while performing the position measurement processing of the edge position θc of the thermal shield 8 is performed in a short period of time and at high working efficiency.

A first aspect of the present invention provides position measuring device applied to a semiconductor single crystal manufacturing device for manufacturing a semiconductor crystal by pulling up and growing a semiconductor single crystal from a melt housed in a furnace crucible, which includes: a thermal shield located above the melt and provided around the semiconductor single crystal, and having a rim at the lower end thereof; light emitting means for emitting light; light scanning means for performing scanning of the light emitted from the light emitting means along a radial direction of the crucible; light receiving means for receiving reflected light of the light emitted from the light emitting means and used to perform scanning by the light scanning means; first distance measuring means for sequentially measuring a distance between a reference point and a reflection point for each prescribed first scanning interval based on a sequential optical scanning position, an emitting position of the light emitting means, and a light receiving position of the light receiving means and according to a principle of triangulation while performing light scanning; first determination means for determining whether the distance measured by the first distance measuring means changes from a size corresponding to a distance between the reference point and the melt to a size corresponding to a distance between the reference point and the rim of the thermal shield, or changes from a size corresponding to the distance between the reference point and the rim of the thermal shield to a size corresponding to the distance between the reference point and the melt; second distance measuring means for sequentially measuring, when the first determination means determines that the measured distance changes, a distance between the reference point and a reflection point for each second scanning interval that is shorter than the first scanning interval, based on a sequential optical scanning position, an emitting position of the light emitting means, and a light receiving position of the light receiving means and according to the principle of triangulation while returning the optical scanning position for a predetermined amount in a direction opposite to a scanning direction and performing re-scanning of the light from the returned optical scanning position; second determination means for determining whether the distance measured by the second distance measuring means changes from a size corresponding to the distance between the reference point and the melt to a size corresponding to the distance between the reference point and the rim of the thermal shield, or changes from a size corresponding to the distance between the reference point and the rim of the thermal shield to a size corresponding to the distance between the reference point and the melt; and edge position judgment means for judging, when the second determination means determines that the measured distance changes, that light is reflected by an edge of the rim of the thermal shield at the optical scanning position at the point in time when the change is determined.

A second aspect of the present invention provides the position measuring device applied to a semiconductor single crystal manufacturing device according to first aspect of the present invention for manufacturing a semiconductor single crystal while measuring a distance between a thermal shield and a melt or/and a liquid level of the melt during pulling of the semiconductor single crystal and performing control so that the measurement becomes a desired value, which further includes: pulling distance measuring means for fixing as the pulling position the position in the direction of scanning light during the pulling of the semiconductor single crystal, and measuring the distance between the thermal shield and the melt or/and the liquid level of the melt based on the fixed scanning position during the pulling, the emitting position of the light emitting means, and the light receiving position of the light receiving means and according to the principle of triangulation, wherein the fixed scanning position during the pulling is defined based on the optical scanning position when the edge position judgment means judges that light is reflected by the edge of the rim of the thermal shield.

A third aspect of the present invention provides the position measuring device applied to a semiconductor single crystal manufacturing device according to the second aspect of the present invention, wherein the fixed scanning position during the pulling is defined so that light traces a path of reflecting off the liquid level of the melt and the side surface of the rim of the thermal shield, respectively.

A fourth aspect of the present invention provides the position measuring device applied to a semiconductor single crystal manufacturing device according to the first aspect of the present invention, wherein the light scanning means includes a mirror for reflecting the light emitted from the light emitting means, and an actuator for changing an attitude angle of a light reflecting surface of the mirror, and performs scanning of light by driving the actuator and changing the attitude angle of the light reflecting surface of the mirror.

A fifth aspect of the present invention provides the position measuring device applied to a semiconductor single crystal manufacturing device according to the first aspect of the present invention or the fourth aspect of the present invention, wherein the light scanning means performs light scanning by using a stepping motor as the actuator, and the second distance measuring means measures the distance between the reference point and the reflection point each time the stepping motor makes one step rotation.

A sixth aspect of the present invention provides a position measuring method applied to a semiconductor single crystal manufacturing device for manufacturing a semiconductor crystal by pulling up and growing a semiconductor single crystal from a melt housed in a furnace crucible, the method implementing position measurement processing which includes: a first distance measuring step of sequentially measuring a distance between a reference point and a reflection point of light for each prescribed first scanning interval based on a sequential optical scanning position, an emitting position of light, and a light receiving position of light and according to a principle of triangulation while performing scanning of the light along a radial direction of the crucible; a first determination step of determining whether the distance measured in the first distance measuring step changes from a size corresponding to a distance between the reference point and the melt to a size corresponding to a distance between the reference point and a rim of a thermal shield, or changes from a size corresponding to the distance between the reference point and the rim of the thermal shield to a size corresponding to the distance between the reference point and the melt; a second distance measuring step of sequentially measuring, when determination is made that the measured distance changes in the first determination step, a distance between the reference point and a reflection point for each second scanning interval that is shorter than the first scanning interval based on a sequential optical scanning position, an emitting position of the light, and a light receiving position and according to the principle of triangulation while returning the optical scanning position for a predetermined amount in a direction opposite to a scanning direction and performing re-scanning of light from the returned optical scanning position; a second determination step of determining whether the distance measured in the second distance measuring step changes from a size corresponding to the distance between the reference point and the melt to a size corresponding to the distance between the reference point and the rim of the thermal shield, or changes from a size corresponding to the distance between the reference point and the rim of the thermal shield to a size corresponding to the distance between the reference point and the melt; and an edge position judgment step of judging, when determination is made that the measured distance changes in the second determination step, that light reflected by an edge of the rim of the thermal shield at the optical scanning position at the point in time that the change is determined.

A seventh aspect of the present invention provides the position measuring method applied to a semiconductor single crystal manufacturing device according to the sixth aspect of the present invention manufacturing a semiconductor single crystal while measuring a distance between a thermal shield and a melt or/and a liquid level of the melt during pulling of the semiconductor single crystal and performing control so that the measurement becomes a desired value, further including: a step of defining a position of a direction of scanning light during the pulling based on an optical scanning position when determination is made in the edge position judgment step that light is reflected by the edge of the rim of the thermal shield; and a pulling distance measuring step of fixing the position of the direction of scanning light during the pulling of the semiconductor single crystal, and measuring the distance between the thermal shield and the melt or/and the liquid level of the melt based on the fixed scanning position during the pulling, the emitting position of light emitting means, and the light receiving position of light receiving means and according to the principle of triangulation.

An eighth aspect of the present invention according to the seventh aspect of the present invention is that the fixed scanning position during the pulling is defined so that light traces a path of reflecting off the liquid level of the melt and the side surface of the rim of the thermal shield, respectively.

The first aspect of the present invention is now explained with reference to the configuration diagram of FIG. 2, the position measuring algorithm shown in FIG. 7 and FIG. 8, and with reference to FIG. 9A, FIG. 9B, and FIG. 9C.

Specifically, foremost, the first distance measuring means 142 sequentially measures the distance d between the reference point and the reflection point for each prescribed first scanning interval $\Delta\theta 1$ based on the sequential optical scanning position, the emitting position of the light emitting means 110, and the light receiving position of the light receiving means 130, and according to the principle of triangulation while scanning the laser beam 101 in the radial direction of the crucible 3 by the light scanning means 120 (FIG. 9A; step 204).

Subsequently, the first determination means 143 determines whether the distance d measured by the first distance measuring means 142 changes from a size corresponding to the distance da between the reference point and the melt 5 to a size corresponding to the distance db between the reference point and the rim 8a of the thermal shield 8 (step 205).

Subsequently, if the first determination means 143 determines that the measured distance changes (step 205; determination of YES), the optical scanning position $\theta$ is returned a predetermined amount $\phi$ in the opposite direction B of the scanning direction A (FIG. 9A; step 210). The second distance measuring means 144 sequentially measures the distance d between the reference point and the reflection point for each second scanning interval $\Delta\theta 2$ that is shorter than the first scanning interval $\Delta\theta 1$ based on the sequential optical scanning position, the emitting position of the light emitting means, and the light receiving position of the light receiving means, and according to the principle of triangulation while re-scanning the laser beam 101 from the returned optical scanning position $\theta$rs (FIG. 9B); step 211).

Subsequently, the second determination means 145 determines whether the distance d measured by the second distance measuring means 144 changes from a size corresponding to the distance da between the reference point and the melt 5 to a size corresponding to the distance db between the reference point and the rim 8a of the thermal shield 8 (step 212).

If it is consequently determined that the measured distance changes (step 212; determination of YES), it is determined that the laser beam 101 is reflected off the edge 8e of the rim 8a of the thermal shield 8 at the optical scanning position θc at the point in time that the change is determined (step 217).

According to the first aspect of the present invention, even if the irradiation point of the laser beam 101 deviates from the edge 8e and already moves to the back of the upper surface 8b of the rim 8a at the point in time that the initial first determination means determines that it is the edge position, since the optical scanning position is returned a predetermined amount, the distance measurement can be resumed before the edge position. The second distance measurement is performed at an interval of a relatively short cycle Δθ2 in comparison to the initial distance measurement (FIG. 9A). Thus, at the point in time that it is once again determined to be the edge position, the irradiation point of the laser beam 101 does not deviate from the edge 8e and it moves to the back of the upper surface 8b of the rim 8a, and the position of the edge 8e can be measured without error.

In addition, the section of conducting distance measurement for each short interval Δθ2 is a short section up to the re-detection of the edge position from the position θrs at which the optical scanning position is returned a predetermined amount (FIG. 9B; limit value (40 pulses)), and otherwise the distance measurement is conducted for each long interval Δθ1 and the processing is performed at high speed. Thus, the position measurement processing can be completed in a short period of time and the operation can be performed with high efficiency.

As described above, according to the first aspect of the present invention, the edge position θc can be measured accurately without variation while performing the position measurement processing of the edge position θc of the thermal shield 8 in a short period of time and with high working efficiency.

In the second aspect of the present invention, the positions θ1, θ2, θ3, θ4 of the direction of scanning the laser beam 101 during the pulling are defined based on the optical scanning position θc when it is determined that the laser beam 101 is reflected off the edge 8e of the rim 8a of the thermal shield 8 (step 221).

During the pulling of the silicon single crystal, the position of the direction of scanning the laser beam 101 is fixed to the pulling positions θ1, θ2, θ3, θ4, and the distance L between the thermal shield and the melt or/and the liquid level H of the melt are measures based on the fixed scanning position during the pulling, the emitting position of the light emitting means, and the light receiving position of the light receiving means, and according to the principle of triangulation. The silicon single crystal 10 is manufactured while controlling the measurements L, H to become a desired value.

According to the second aspect of the present invention, the edge position θc can be accurately measured without variation for each batch, and the distance S from the reference point to the upper surface 8b of the rim 8a of the thermal shield 8 can be accurately measured without variation.

Thus, it is possible to accurately measure the actual position of the thermal shield/liquid level distance L based on the S measurement, and stably perform the control during the pulling and growth of the silicon single crystal to be conducted upon feeding back the actual position of the thermal shield/liquid level distance L. Consequently, the quality of the pulled and grown silicon single crystal 10 can be stabilized, and it is possible to provide a product of a stable specification.

Moreover, since the edge position θc can be sought accurately, it is possible to accurately irradiate the laser beam 101 onto the target position of the upper surface 8b of the rim 8a of the thermal shield 8 upon accurately defining the irradiation direction of the laser beam 101 based on the edge position θc, and it is also possible to accurately irradiate the laser beam 101 onto the target position of the melt surface 5a. Consequently, even if the distance D between the thermal shield 8 and the silicon single crystal 10 is narrow or if the length of the upper surface 8b of the rim 8a of the thermal shield 8 in the crucible radial direction is short, it is possible to accurately irradiate the laser beam 101 onto the target position, and the distance measurement shown in FIG. 2 can be conducted easily. Similarly, the distance measurement shown in FIG. 3 can also be conducted easily.

In the third aspect of the present invention, as shown in FIG. 10, the fixed scanning positions θ5, θ6 during the pulling are defined so that the laser beam 101 traces a path of reflecting off the liquid level 5a of the melt 5 and the side surface 8d of the rim 8a of the thermal shield 8, respectively.

Specifically, as shown in FIG. 10, foremost, the stepping motor 122 is driven to position the optical scanning position θ at the pulling position θ5. Subsequently, the laser beam 101 is emitted from the light emitting means 110 and irradiated onto the side surface 8d of the rim 8a of the thermal shield 8, the laser beam that reflects off the rim side surface 8d is irradiated onto the melt level 5a, and the laser beam that reflects off the melt level 5a is received by the light receiving means 130. Subsequently, the distance LS from the reference point to the liquid level 5a of the melt 5 is sought and the melt liquid level H is measured based on the fixed scanning position θ5 during the pulling, the emitting position of the light emitting means 110, and the light receiving position of the light receiving means 130, and according to the principle of triangulation.

Subsequently, the stepping motor 122 is driven to position the optical scanning position θ at the pulling position θ6. Subsequently, the laser beam 101 is emitted from the light emitting means 110 and irradiated onto the upper surface 8b of the rim 8a of the thermal shield 8, and the laser beam that reflects off the rim upper surface 8b is received by the light receiving means 130. Subsequently, the distance S from the reference point to the upper surface 8b of the rim 8a of the thermal shield 8 is measured based on the fixed scanning position θ6 during the pulling, the emitting position of the light emitting means 110, and the light receiving position of the light receiving means 130, and according to the principle of triangulation. The thermal shield/liquid level distance L is calculated based on the thus obtained distance LS up to the liquid level 5a of the melt 5, the distance S up to the upper surface 8b of the rim 8a of the thermal shield 8, and the thickness t of the rim 8a of the thermal shield 8.

With the distance measuring method shown in FIG. 10, since the laser beam 101 must be irradiated onto an extremely narrow side surface 8d of the rim 8a of the thermal shield 8, it is necessary to accurately define the fixed scanning position θ5 during the pulling and improve the irradiation accuracy of the laser beam 10.

According to this invention, since the edge position θc can be sought accurately, it is be possible to accurately define the fixed scanning position θ5 during the pulling based on the edge position θc, and thereby accurately irradiating the laser beam 101 onto the target position of the upper surface 8b of the rim 8a of the thermal shield 8 upon accurately defining the irradiation direction of the laser beam 101. Consequently, even with the distance measuring method shown in FIG. 10 where the laser beam 101 must be irradiated onto an extremely narrow side surface 8d of the rim 8a of the thermal shield 8, the laser beam 101 can be accurately irradiated onto the target position, and the distance measurement shown in FIG. 10 can be conducted easily.

In the fourth aspect of the present invention, as shown in FIG. 4, light scanning means 120 is configured by including a mirror 121 for reflecting the laser beam 101 that is emitted from the light emitting means 110, and an actuator 122 for changing the attitude angle of the light reflecting surface 121a of the mirror 121, and scans the laser beam 101 by driving the actuator 122 and changing the attitude angle of the light reflecting surface 121 of the mirror 121.

In the fifth aspect of the present invention, as shown in FIG. 4, the light scanning means 120 scans the laser beam 101 by using the stepping motor 122 as the actuator. The second distance measuring means 144 measures the distance between the reference point and the reflection point while the optical scanning position moves a minute interval $\Delta\theta 2$ each time the stepping motor 122 makes a one step rotation.

The sixth aspect of the present invention, the seventh aspect of the present invention, and the eighth aspect of the present invention are method inventions corresponding to the device inventions of the first aspect of the present invention, the second aspect of the present invention, and the third aspect of the present invention, respectively.

BEST MODE FOR CARRYING OUT THE INVENTION

An embodiment of the position measuring device and the position measuring method in a semiconductor single crystal manufacturing device according to the present invention is now explained with reference to the attached drawings.

FIG. 1 is a side view showing an example of the configuration of a silicon single crystal manufacturing device that is used in the present embodiment.

As shown in FIG. 1, a silicon single crystal manufacturing device 1 of this embodiment comprises a CZ furnace (chamber) 2 as the single crystal pulling container.

The CZ furnace 2 is internally provided with a quartz crucible 3 for melting a polycrystalline silicon raw material and housing it as a melt 5. The outside of the quartz crucible 3 is covered with a graphite crucible 11. A heater 9 for heating and melting the polycrystalline silicon raw material in the quartz crucible 3 is provided around the quartz crucible 3. The heater 9 is formed in a cylindrical shape. The output (power; kW) of the heater 9 is controlled so as to adjust the thermal dose to the melt 5. For example, the output of the heater 9 is controlled so that the temperature of the melt 5 is detected and, with the detected temperature as the feedback amount, and the temperature of the melt 5 becomes the target temperature.

A pulling mechanism 4 is provided above the quartz crucible 3. The pulling mechanism 4 includes a pulling axis 4a, and a seed chuck 4c at the tip of the pulling axis 4a. The seed crystal 14 is gripped by the seed chuck 4c.

The polycrystalline silicon (Si) is heated and melted in the quartz crucible 3. When the temperature of the melt 5 is stabilized, the pulling mechanism 4 is operated and the silicon single crystal 10 (silicon single crystal) is pulled up from the melt 5. Specifically, the pulling axis 4a is lowered and the seed crystal 14 gripped by the seed chuck 4c at the tip of the pulling axis 4a is immersed in the melt 5. After the seed crystal 14 is submerged in the melt 5, the pulling axis 4a is raised. The silicon single crystal 10 grows pursuant to the pulling of the seed crystal 14 gripped by the seed chuck 4c.

During the pulling, the quartz crucible 3 is rotated with a rotational axis 15. Moreover, the pulling axis 4a of the pulling mechanism 4 rotates in the opposite direction or same direction as the rotational axis 15.

The rotational axis 15 can be driven in the vertical direction, and is able to move the quartz crucible 3 vertically to an arbitrary crucible position, and thereby adjusting a surface 5a of the melt 5, namely, the liquid level H of the melt 5.

By blocking off the inside of the CZ furnace 2 and the outside air, the inside of the furnace 2 is maintained in a vacuum (for instance, approximately several ten Torr). Specifically, argon gas 7 is supplied as the inert gas into the CZ furnace 2, and discharged with a pump from the outlet of the CZ furnace 2. The inside of the furnace 2 is thereby depressurized to a prescribed pressure.

Various evaporants are generated in the CZ furnace 2 during the single crystal pulling process (1 batch). Thus, argon gas 7 is supplied into the CZ furnace 2 and discharged outside the CZ furnace 2 together with the evaporants in order to eliminate the evaporants from the CZ furnace 2 and clean the inside of the CZ furnace 2. The supplied flow rate of the argon gas 7 is set for each step in 1 batch.

The melt 5 decreases pursuant to the pulling of the silicon single crystal 10. The contact area of the melt 5 and the quartz crucible 3 changes pursuant to the decrease in the melt 5, and the amount of dissolved oxygen from the quartz crucible 3 changes. This change affects the oxygen concentration distribution in the pulled silicon single crystal 10.

Moreover, a thermal shield 8 (heat radiation plate, gas straightening tube) is provided above the melt 5 and around the silicon single crystal 10. The thermal shield 8 is formed in a conical shape comprising an opening 8A in the center thereof. A rim 8a is provided to the lower end of the thermal shield 8. The rim 8a has an upper surface 8b, a lower surface 8c, and a side surface 8d. Here, the boundary of the upper surface 8b and the side surface 8d of the rim 8a is defined as the edge 8e.

The opening 8A at the center of the thermal shield 8 houses the silicon single crystal 10. The distance between the side surface 8d of the rim 8a of the thermal shield 8 and the side surface of the silicon single crystal 10 (hereinafter referred to as the "thermal shield/crystal distance") is defined as D.

The thermal shield 8 guides, within the CZ furnace 2, argon gas 7 as the carrier gas to be supplied from the upper side to the center of the melt surface 5a, and further guides it to the peripheral edge of the melt surface 5a by passing it through the melt surface 5a. The argon gas 7 is thereafter discharged from an outlet provided to the lower part of the CZ furnace 2 together with the gas that evaporated from the melt 5. Consequently, it is possible to stabilize the gas flow rate on the liquid level and maintain the oxygen that evaporated from the melt 5 in a stable state.

Moreover, the thermal shield 8 insulates and shields a seed crystal 14 and the silicon single crystal 10 grown from the seed crystal 14 from the heat radiation generated in the hot areas such as the quartz crucible 3, the melt 5, and a heater 9. The thermal shield 8 also prevents impurities (for instance, silicon oxide) generated in the furnace from adhering to the silicon single crystal 10 and inhibiting the single crystal growth.

The size of the distance L (thermal shield/liquid level distance L) between the rim 8a at the lower end of the thermal shield 8 and the melt surface 5a can be adjusted by lifting and lowering the rotational axis 15 and changing the vertical position of the quartz crucible 3. The distance L can also be adjusted by moving the thermal shield 8 in a vertical direction using a lifting and lowering device.

Quality of the silicon single crystal 10 is conventionally known to fluctuate in accordance with the size of the melt liquid level H or the thermal shield/liquid level distance L during the pulling. Specifically, if the size of the melt liquid level H or the thermal shield/liquid level distance L changes during the pulling, parameters such as the temperature gradient in the axial direction of the silicon single crystal 10 consequently fluctuate, thereby causing the defect region distribution and oxygen concentration distribution of the silicon single crystal 10 to change. As a result, the quality of the crystal also changes.

Thus, in order to obtain the crystal quality of the demanded specification, pulling conditions, that is, the target value of the melt liquid level H for each pulling position or the target value of the thermal shield/liquid level distance L for each pulling position is predetermined according to the demanded specification. During the pulling and growing process, the actual values of the melt liquid level H or the actual values of the thermal shield/liquid level distance L are sequentially detected, these detected values are fed back, and control is performed to adjust the vertical position of the rotational axis 15 so that the deviation of the target value and the detected value becomes zero.

In this embodiment, a case of pulling the silicon single crystal 10 with the Magnetic Field Applied Czochralski Method (MCZ method) is assumed. Incidentally, the MCZ method is one mode of the CZ method.

Specifically, for instance, a magnet 30 is arranged around the CZ furnace 2 with the MCZ method. In this embodiment, the magnet 30 is provided such that the solid-liquid interface between the silicon single crystal 10 and the melt 5 has an upwardly convex shape.

As a result of the magnet 30 being arranged around the CZ furnace 2, a horizontal magnetic field (transverse magnetic field) is applied to the melt 5 in the quartz crucible 3. When the horizontal magnetic field is applied to the melt 5, the convention current of the melt 5 in the quartz crucible 3 is suppressed, and the shape of the solid-liquid interface between the silicon single crystal 10 and the melt 5 is stabilized in the intended concave shape, the cooling rate CR can be stably increased, and the growth speed V can also be increased. Incidentally, a cusped magnetic field may be applied in substitute for the horizontal magnetic field.

In order to stably obtain a crystal quality of the demanded specification, the melt liquid level H or the thermal shield/liquid level distance L must be controlled to accurately coincide with the target value. In order to realize the above, the actual value of the melt liquid level H or the actual value of the thermal shield/liquid level distance L as the feedback amount to be detected during the control must constantly be measured with accuracy.

FIG. 2 shows a configuration example of the distance measuring device for measuring the actual value of the melt liquid level H or the thermal shield/liquid level distance L for each pulling position.

The distance measuring device 100 of FIG. 2 is configured by including light emitting means 110 for emitting a laser beam 101, light scanning means 120 for scanning the laser beam 101 that is emitted from the light emitting means 110 along the radial direction of the quartz crucible 3, light receiving means 130 for receiving the reflected light of the laser beam 101 that is emitted from the light emitting means 110 and used to perform scanning of the light scanning means 120, and a controller 140.

The light scanning means 120 is configured by including a mirror 121 for reflecting the laser beam 101 so that the laser beam 101 that is emitted from the light emitting means 110 head from the outside of the CZ furnace 2 toward the inside of the CZ furnace 2 via a window 2w of the CZ furnace 2, a stepping motor 122 for changing the attitude angle of a light reflecting surface 121a of the mirror 121, and a prism 123 for reflecting the laser beam that is reflected off the light reflecting surface 121a of the mirror 121 so that such laser beam is irradiated toward the lower part of the CZ furnace 2.

Here, the rotation angle θ of the rotational axis 122a of the stepping motor 122 and the scanning position of the laser beam 101 in the radial direction of the crucible 3 correspond one-to-one. Thus, in this specification, the scanning position of the laser beam 101 in the crucible radial direction is represented as θ.

The light receiving means 130 is configured by including a CCD sensor.

The controller 140 is configured by including pulling distance measuring means 141.

The pulling distance measuring means 141 measures the thermal shield/liquid level distance L or/and the melt liquid level H based on the fixed scanning position during the pulling, the laser beam emitting position of the light emitting means 110 and the light receiving position of the light receiving means 130, and according to the principle of triangulation. The pulling distance measuring means 141 performs processing to compute the thermal shield/liquid level distance L or/and melt liquid level H based on the detection signal and the like output from the CCD sensor 131.

The various types of distance measuring methods for measuring the actual value of the melt liquid level H or the actual value of the thermal shield/liquid level distance L are now explained.

(First Distance Measuring Method)

Specifically, foremost, as shown in FIG. 2, the stepping motor 122 is driven to position the optical scanning position θ at the pulling position θ1. Subsequently, the laser beam 101 is emitted from the light emitting means 110. The light scanning means 120 irradiates the laser beam 101 toward the melt level 5a. The laser beam that reflects off the melt level 5a is received by the light receiving means 130. Subsequently, the pulling distance measuring means 141 seeks the distance LS from the reference point to the liquid level 5a of the melt 5 and measures the melt liquid level H based on the fixed scanning position θ1 during the pulling, the emitting position of the light emitting means 110, and the light receiving position of the light receiving means 130, and according to the principle of triangulation.

Subsequently, the stepping motor 122 is driven to position the optical scanning position θ at the pulling position θ2. Subsequently, the laser beam 101 is emitted from the light emitting means 110. The light scanning means 120 irradiates the laser beam 101 toward the upper surface 8b of the rim 8a of the thermal shield 8. The laser beam that reflects off the rim upper surface 8b is received by the light receiving means 130. Subsequently, the pulling distance measuring means 141 measures the distance S from the reference point to the upper surface 8b of the rim 8a of the thermal shield 8 based on the fixed scanning position θ2 during the pulling, the emitting position of the light emitting means 110, and the light receiving position of the light receiving means 130, and according to the principle of triangulation. The thermal shield/liquid level distance L is calculated based on the thus obtained distance LS up to the liquid level 5a, the distance S up to the upper surface 8b of the rim 8a of the thermal shield 8, and the thickness t of the rim 8a of the thermal shield 8.

(Second Distance Measuring Method)

Specifically, as shown in FIG. 3, foremost, the stepping motor 122 is driven to position the optical scanning position θ at the pulling position θ3. Subsequently, the laser beam 101 is emitted from the light emitting means 110. The light scanning means 120 irradiates the laser beam 101 toward the melt level 5*a*. The laser beam that reflects off the melt level 5*a* is irradiated onto the lower surface 8*c* of the rim 8*a* of the thermal shield 8, the laser beam that reflects off the rim lower surface 8*c* is irradiated onto the melt level 5*a* once again, and the laser beam that reflects off the melt level 5*a* is received by the light receiving means 130. Subsequently, the pulling distance measuring means 141 seeks the distance LS from the reference point to the liquid level 5*a* of the melt 5 and measures the melt liquid level H based on the fixed scanning position θ3 during the pulling, the emitting position of the light emitting means 110, and the light receiving position of the light receiving means 130, and according to the principle of triangulation.

Subsequently, the stepping motor 122 is driven to position the optical scanning position θ at the pulling position θ4. Subsequently, the laser beam 101 is emitted from the light emitting means 110. The light scanning means 120 irradiates the laser beam 101 toward the upper surface 8*b* of the rim 8*a* of the thermal shield 8. The laser beam that reflects off the rim upper surface 8*b* is received by the light receiving means 130. Subsequently, the pulling distance measuring means 141 measures the distance S from the reference point to the upper surface 8*b* of the rim 8*a* of the thermal shield 8 based on the fixed scanning position θ4 during the pulling, the emitting position of the light emitting means 110, and the light receiving position of the light receiving means 130, and according to the principle of triangulation. The thermal shield/liquid level distance L is calculated based on the thus obtained distance LS up to the liquid level 5*a* of the melt 5, the distance S up to the upper surface 8*b* of the rim 8*a* of the thermal shield 8, and the thickness t of the rim 8*a* of the thermal shield 8.

(Third Distance Measuring Method)

In the third distance measuring method, as shown in FIG. 10, the fixed scanning positions θ5, θ6 during the pulling are defined so that the laser beam 101 traces a path of reflecting off the liquid level 5*a* of the melt 5 and the side surface 8*d* of the rim 8*a* of the thermal shield 8, respectively.

Specifically, as shown in FIG. 10, foremost, the stepping motor 122 is driven to position the optical scanning position θ at the pulling position θ5. Subsequently, the laser beam 101 is emitted from the light emitting means 110. The light scanning means 120 irradiates the laser beam 101 toward the side surface 8*d* of the rim 8*a* of the thermal shield 8. The laser beam that reflects off the rim side surface 8*d* is irradiated onto the melt level 5*a*, and the laser beam that reflects off the melt level 5*a* is received by the light receiving means 130. Subsequently, the pulling distance measuring means 141 seeks the distance LS from the reference point to the liquid level 5*a* of the melt 5 and measures the melt liquid level H based on the fixed scanning position θ5 during the pulling, the emitting position of the light emitting means 110, and the light receiving position of the light receiving means 130, and according to the principle of triangulation.

Subsequently, the stepping motor 122 is driven to position the optical scanning position θ at the pulling position θ6. Subsequently, the laser beam 101 is emitted from the light emitting means 110. The light scanning means 120 irradiates the laser beam 101 toward the upper surface 8*b* of the rim 8*a* of the thermal shield 8. The laser beam that reflects off the rim upper surface 8*b* is received by the light receiving means 130. Subsequently, the pulling distance measuring means 141 measures the distance S from the reference point to the upper surface 8*b* of the rim 8*a* of the thermal shield 8 based on the fixed scanning position θ6 during the pulling, the emitting position of the light emitting means 110, and the light receiving position of the light receiving means 130, and according to the principle of triangulation. The thermal shield/liquid level distance L is calculated based on the thus obtained distance LS up to the liquid level 5*a* of the melt 5, the distance S up to the upper surface 8*b* of the rim 8*a* of the thermal shield 8, and the thickness t of the rim 8*a* of the thermal shield 8.

Although in FIG. 10 the laser beam 101 traces a path of being reflected in the order of the side surface 8*d* of the rim 8*a* of the thermal shield 8, and the liquid level 5*a* of the melt 5, the laser beam 101 may also trace a path of being reflected in the order of the liquid level 5*a* of the melt 5, and the side surface 8*d* of the rim 8*a* of the thermal shield 8, as a different mode of the third distance measuring method.

The foregoing optical scanning positions θ1, θ2, θ3, θ4, θ5, θ6 during the pulling are defined based on the reference optical scanning position θc. The reference optical scanning position θc is the edge 8*e* of the rim 8*a* of the thermal shield 8.

The position measurement of the edge position θ is conducted by the controller 140 of the distance measuring device 100 shown in FIG. 2 (FIG. 3, FIG. 10).

This position measurement processing is performed, for instance, between the respective batches, during the disassembly or cleaning of the CZ furnace 2, or midway during the pulling process.

The position measurement processing of the edge position θc to be performed by the distance measuring device 100 during the pulling is now explained with reference to the position measuring algorithm shown in FIG. 7 and FIG. 8, and with reference to FIG. 9A, FIG. 9B, and FIG. 9C.

Specifically, foremost, the first distance measuring means 142 sequentially measures the distance d between the reference point and the reflection point for each prescribed first scanning interval Δθ1 based on the sequential optical scanning position, the emitting position of the light emitting means 110, and the light receiving position of the light receiving means 130, and according to the principle of triangulation while the light scanning means 120 is scanning the laser beam 101 in the radial direction of the crucible 3 (FIG. 9A; step 204).

Subsequently, the first determination means 143 determines whether the distance d measured by the first distance measuring means 142 changes from a size corresponding to the distance da between the reference point and the melt 5 to a size corresponding to the distance db between the reference point and the rim 8*a* of the thermal shield 8 (step 205).

Subsequently, if the first determination means 143 determines that the measured distance changes (step 205; determination of YES), the optical scanning position θ is returned a predetermined amount φ in the opposite direction B of the scanning direction A (FIG. 9A; step 210). The second distance measuring means 144 sequentially measures the distance d between the reference point and the reflection point for each second scanning interval Δθ2 that is shorter than the first scanning interval Δθ1 based on the sequential optical scanning position, the emitting position of the light emitting means, and the light receiving position of the light receiving means, and according to the principle of triangulation while re-scanning the laser beam 101 from the returned optical scanning position θrs (FIG. 9B; step 211).

Subsequently, the second determination means 145 determines whether the distance d measured by the second distance measuring means 144 changes from a size corresponding to the distance da between the reference point and the melt 5 to a size corresponding to the distance db between the reference point and the rim 8*a* of the thermal shield 8 (step 212).

If it is consequently determined that the measured distance changes (step 212; determination of YES), it is determined that the laser beam 101 is reflected off the edge 8*e* of the rim 8*a* of the thermal shield 8 at the optical scanning position θc at the point in time that the change is determined (FIG. 9C; step 217).

This is now explained in further detail.

Foremost, the scanning position θ of the laser beam 101 is moved to and positioned at the scanning start position θs (FIG. 9C; step 201).

Subsequently, the stepping motor 122 is driven, and the scanning the laser beam 101 toward the thermal shield 8 side direction A is started (step 202).

The sequential scanning position θ of the laser beam 101 is detected and whether the sequential scanning position θ is within the final scanning position θe obtained by adding the maximum scanning width W to the scanning start position θs is determined (FIG. 9C; step 203).

Subsequently, the distance d between the reference point and the reflection point is sequentially measured for each prescribed first scanning interval Δθ1 (FIG. 9A; step 204).

Subsequently, by determining whether the measured distance d is within the predetermined range of distance db−Δd to db+Δd, it is determined whether the laser beam scanning position θ reaches the vicinity of the edge 8*e* of the thermal shield 8. The distance db−Δd to db+Δd is defined as a size corresponding to the distance from the reference point to the rim 8*a* of the thermal shield 8 (FIG. 9C; step 205).

So as long as the determination at step 203 is YES and the determination at step 205 is NO, that is, so as long as it is determined that the laser beam scanning position θ reaches the final scanning position θe and reaches the vicinity of the edge 8*e* of the thermal shield 8, the distance measurement (step 204) is repeated. The interval Δθ1 of the distance measurement is defined based on the cycle time of the processing of step 203 to step 204 to step 205 and the rotating speed of the stepping motor 122. In the scanning interval until the laser beam scanning position θ reaches the vicinity of the edge 8*e* of the thermal shield 8, the distance measurement is conducted in a long scanning interval Δθ1 while the stepping motor 122 is rotated at high speed and the scanning of the laser beam 101 is performed at high speed. Thus, the processing is performed at high speed.

Nevertheless, if the laser beam scanning position θ reaches the final scanning position θe without any determination that it reaches the vicinity of the edge 8*e* of the thermal shield 8 (step 203; determination of NO), an error message or the like is displayed to indicate a malfunction, such malfunction is notified to the operator (step 227), and the entire processing is ended.

Meanwhile, if it is determined that the laser beam scanning position θ reached the vicinity of the edge 8*e* of the thermal shield 8 without reaching the final scanning position θe (step 205; determination of YES), the drive of the stepping motor 122 is stopped (step 206), and the process is moved to the stage of confirming where the laser beam scanning position θ reaches the edge 8*e* of the thermal shield 8 (steps 207, 208, 209, 225, 226).

Specifically, the distance d is repeatedly measured n times (for instance, 20 times) (step 207).

Subsequently, whether the following conditions are satisfied is determined.

1) The measured distance d of m times (for instance, 20 times) or more among the respective distances d that are measured n times is within the predetermined range of distance db−Δd to db+Δd.

2) The difference ε between the maximum value and the minimum value among the respective distances d that are measured n times is less than the tolerable measurement error Δε (step 208).

Consequently, if the conditions of 1) and 2) above are satisfied (step 208; determination of YES), the laser beam scanning position θ at such time is determined to be the "tentative edge position" (step 209).

However, if the conditions of 1) and 2) above were not satisfied (step 208; determination of NO), the stepping motor 122 is moved a minimal step, that is, moved 1 step so as to repeatedly perform the distance measurement (step 207) and the determination processing (step 208).

Each time the stepping motor 122 is moved a minimal step (1 step), the count value i is incremented by 1 (step 225). So as long as the count value i does not exceed the limit value imax (step 226; determination of YES), the distance measurement (step 207) and the determination processing (step 208) are repeated n times. However, if the count value i exceeds the limit value imax (step 226; determination of NO), it is deemed that process is still at the stage where the laser beam 101 is irradiated to the melt surface 5*a* or the side surface 8*d* of the rim 8*a* of the thermal shield 8, and is not of a stage of confirming whether the laser beam scanning position θ reaches the edge 8*a*. Thus, the processing routine returns to step 203, and the distance measurement (step 204) is conducted once again at a long scanning interval Δθ1.

Meanwhile, at the point in time that the laser beam scanning position θ is determined to be the "tentative edge position" at step 209, there are cases where the laser beam scanning position θ goes beyond the actual position of the edge 8*e* and reaches the back of the upper surface 8*b* of the rim 8*a* (see FIG. 9A). As described above, this is because, in the scanning interval until the laser beam scanning position θ reaches the vicinity of the edge 8*e* of the thermal shield 8, the distance measurement is conducted in a long scanning interval Δθ1 while the stepping motor 122 is rotated at high speed and the scanning of the laser beam 101 is performed at high speed (step 204). Thus, at the point in time that it is determined to be the "edge position" in the distance measurement, there is a possibility that the laser beam scanning position θ may pass the actual edge position.

Thus, in consideration of such "passing" of the laser beam scanning position θ, at the point in time that the laser beam scanning position θ is determined to be the "tentative edge position" at step 209, the processing routine enters a stage of returning the optical scanning position θ a predetermined amount φ in the opposite direction B of the scanning direction A (FIG. 9A; step 210), and conducting a detailed search regarding whether the laser beam scanning position θ reaches the edge 8*e* of the thermal shield 8 at a cycle Δθ2 that is shorter than the scanning interval Δθ1 (steps 211 to 214).

Specifically, when the laser beam scanning position θ is determined to be the "tentative edge position" (step 209; determination of YES), the stepping motor 122 is rotatably driven in the opposite direction for a prescribed number of pulses (for instance, 20 pulses), and the optical scanning position θ is returned a predetermined amount φ from the current scanning position to the opposite direction B of the scanning direction A, that is, toward direction B that recedes from the thermal shield 8 (FIG. 9A; step 210).

Next, the distance d is measured (step 211).

Subsequently, by determining whether the measured distance d is within the predetermined range of distance db−Δd to db+Δd, it is determined whether the laser beam scanning position θ reaches the vicinity of the edge 8e of the thermal shield 8. The distance db−Δd to db+Δd is defined as a size corresponding to the distance from the reference point to the rim 8a of the thermal shield 8 (step 212).

If the determination at step 212 is NO, the laser beam 101 is moved a minimal step at a time, that is, the stepping motor 122 is moved 1 step at a time from the returned scanning start position θrs to the thermal shield 8 side direction A, and the distance measurement (FIG. 9B; step 211) and the determination processing (step 212) for each interval Δθ2 are repeated 1 step at a time.

Each time the stepping motor 122 is moved a minimal step (1 step), the count value j is incremented by 1 (step 213). The limit value jmax of the count value j is set to a prescribed number of pulses (for instance, 40 pulses) from the returned scanning start position θrs (FIG. 9B). Thus, so as long as the count value j does not exceed the limit value jmax (40 pulses) (step 214; determination of YES), the distance measurement (step 211) and the determination processing (step 212) for each interval Δθ2 are repeated 1 step at a time. However, if the count value j exceeds the limit value jmax (40 pulses) (step 214; determination of NO), it is deemed that process is still at the stage where the laser beam 101 is irradiated onto the melt surface 5a or the side surface 8d of the rim 8a of the thermal shield 8, and is not of a stage of confirming whether the laser beam scanning position θ reaches the edge 8a. Thus, the processing routine returns to step 203, and the distance measurement (step 204) is conducted once again at a long scanning interval Δθ1.

Meanwhile, if it is determined that the laser beam scanning position θ reaches the vicinity of the edge 8e of the thermal shield 8 (step 212; determination of YES) without reaching the scanning position obtained by adding a fixed value corresponding to the foregoing prescribed number of pulses (40 pulses) to the returned scanning start position θre (step 214; determination of YES), the processing routine enters a stage of confirming whether the laser beam scanning position θ reaches the edge 8e of the thermal shield 8 (steps 215, 216, 217, 218, 219, 220).

Specifically, the distance d is repeatedly measured p times (for instance, 20 times) (step 215).

Subsequently, whether the following conditions are satisfied is determined.

3) The measured distance d of q times (for instance, 20 times) or more among the respective distances d that were measure p times is within the predetermined range of distance db−Δd to db+Δd.

4) The difference ε between the maximum value and the minimum value among the respective distances d that were measured p times is less than the tolerable measurement error Δε (step 216).

Consequently, if the conditions of 3) and 4) above are satisfied (step 216; determination of YES), the laser beam scanning position θ at such time is determined to be the final edge position (step 217).

However, if the conditions of 3) and 4) above were not satisfied (step 216; determination of NO), the stepping motor 122 is moved a minimal step, that is, moved 1 step, and the distance measurement (step 215) and the determination processing (step 216) are repeated p times for each interval Δθ2 1 step at a time.

Specifically, each time the stepping motor 122 is moved a minimal step (1 step), the count value j is incremented by 1 and the count value k is also incremented by 1 (step 218). So as long as the count value j does not exceed the prescribed number of pulses (40 pulses) (step 219; determination of YES), and the count value k does not exceed the limit value kmax (step 220; determination of YES), the distance measurement (step 215) and the determination processing (step 216) are repeated p times for each interval Δθ2. However, if the count value j exceeds the limit value jmax (40 pulses) (step 219; determination of NO), it is deemed that process is still at the stage where the laser beam 101 is irradiated onto the melt surface 5a or the side surface 8d of the rim 8a of the thermal shield 8, and is not of a stage of confirming whether the laser beam scanning position θ reaches the edge 8a. Thus, the processing routine returns to step 203, and the distance measurement (step 204) is conducted once again at a long scanning interval Δθ1. Moreover, even in cases where the count value j does not exceed the limit value jmax (40 pulses) (step 219; determination of YES), if the count value k exceeds the limit value kmax (step 220; determination of NO), it is deems that the laser beam scanning position θ does not yet reach the vicinity of the edge 8a. Thus, the processing routine returns to step 211, and the distance measurement (step 211) is conducted once for each interval Δθ2.

If the laser beam scanning position θ is determined to be the final edge position at step 217 above, the rewrite processing of the optical scanning positions θ1, θ2, θ3, θ4, θ5, θ6 during the pulling is thereafter performed.

Specifically, the optical scanning positions are moved a predetermined scan size from the optical scanning position θc that is determined to be the final edge position at step 217 toward the direction B, that is, the direction B of the crystal 10 that recedes from the thermal shield 8, and are positioned at the optical scanning positions θ1, θ3, θ5 (step 221).

Subsequently, the light emitting means 110 emits the laser beam 101 to measure the distance from the reference point to the reflection point, and the distance LS up to the liquid level 5a of the melt 5 is sought. The sought distance LS is displayed on a screen (step 222).

Subsequently, whether to rewrite the optical scanning positions θ1, θ3, θ5 is determined (step 223).

When it is determined that the optical scanning positions θ1, θ3, θ5 are to be rewritten, the optical scanning positions θ1, θ3, θ5 are updated from their previous values and rewritten (step 224).

Similarly, if the laser beam scanning position θ is determined to be the final edge position at step 217, the optical scanning positions are moved a predetermined scan size from the optical scanning position θc that is determined to be the final edge position at step 217 toward the direction A, that is, the direction A that advances from the crystal 10 toward the thermal shield 8, and are positioned at the optical scanning positions θ2, θ4, θ6 (step 221).

Subsequently, the light emitting means 110 emits the laser beam 101 to measure the distance from the reference point to the reflection point, and the distance S up to the upper surface 8b of the rim 8a of the thermal shield 8. The sought distance S is displayed on a screen (step 222).

Subsequently, whether to rewrite the optical scanning positions θ2, θ4, θ6 is determined (step 223).

When it is determined that the optical scanning positions θ2, θ4, θ6 are to be rewritten, the optical scanning positions θ2, θ4, θ6 are updated from their previous values and rewritten (step 224).

The optical scanning positions θ1, θ2, θ3, θ4, θ5, θ6 that are thus rewritten as described above are used in the next distance measurement, that is, in the distance measurement based on the foregoing first distance measuring method, second distance measuring method, and third distance measuring method. Specifically, the optical scanning position θ is fixed to the rewritten optical scanning positions θ1, θ2, θ3, θ4, θ5, θ6, and then used in the distance measurement based on the foregoing first distance measuring method, second distance measuring method, and third distance measuring method.

The effect of the present embodiment is now explained.

According to this embodiment, even if the irradiation point of the laser beam 101 deviates from the edge 8e and already moves to the back of the upper surface 8b of the rim 8a at the point in time that the initial determination determines that it is the edge position, since the optical scanning position θ is returned a predetermined amount φ, the distance measurement can be resumed before the edge position. The second distance measurement is performed at an interval of a relatively short cycle 402 in comparison to the initial distance measurement (FIG. 9A). Thus, at the point in time that it is once again determined to be the edge position, the irradiation point of the laser beam 101 does not deviate from the edge 8e and moves to the back of the upper surface 8b of the rim 8a, and the position of the edge 8e can be measured without error.

FIG. 6B shows the experimental data of this embodiment.

FIG. 6B is a diagram corresponding to the conventional experimental data of FIG. 6A, and is experimental data showing the variation in the measurement S for each batch. In the experiment, the edge position is measured for each batch, the optical scanning positions θ2, θ4 based on the edge position were rewritten for each batch, and the laser beam 101 is emitted by fixing the positions to the rewritten optical scanning positions θ2, θ4 to measure the S value for each batch. The horizontal axis of the histogram represents the deviation from the average value of the S measurement, and the average value is set to 0. Meanwhile, the vertical axis represents the frequency. As evident upon comparing FIG. 6B and FIG. 6A, conventionally, the S value varied within the range of ±3 mm of the average value in the S measurement. However, in this embodiment, the variation in the S measurement is inhibited to be within the range of ±1.5 mm of the average value, and it is obvious that the variation in the S value is inhibited extremely favorably.

Although the S measurement was explained above, similarly, the values of other distance measurements to be conducted based on the edge position, that is, the thermal shield/liquid level distance L and the melt liquid level H are similarly of extreme high precision without much variation.

Thus, it is possible to stably perform the control during the pulling and growth of the silicon single crystal to be conducted upon feeding back the actual position of the thermal shield/liquid level distance L or the melt liquid level H. Consequently, the quality of the pulled up and grown silicon single crystal 10 can be stabilized, and it is possible to provide a product of a stable specification.

Moreover, since the edge position θc can be sought accurately, it is possible to accurately irradiate the laser beam 101 onto the target position of the upper surface 8b of the rim 8a of the thermal shield 8 upon accurately defining the irradiation direction of the laser beam 101 based on the edge position θc, and it is also possible to accurately irradiate the laser beam 101 onto the target position of the melt surface 5a. Consequently, even if the distance D between the thermal shield 8 and the silicon single crystal 10 is narrow or if the length of the upper surface 8b of the rim 8a of the thermal shield 8 in the crucible radial direction is short, it is possible to accurately irradiate the laser beam 101 onto the target position, and the measurement by the first distance measurement method shown in FIG. 2 can be conducted easily. Similarly, the measurement by the second distance measurement method shown in FIG. 3 can also be conducted easily.

In particular, with the third distance measuring method shown in FIG. 10, since the fixed scanning positions θ5, θ6 during the pulling must be defined so that the laser beam 101 traces a path of being reflected off the liquid level 5a of the melt 5 and the side surface 8d of the rim 8a of the thermal shield 8, the laser beam 101 must be irradiated onto an extremely narrow side surface 8d of the rim 8a of the thermal shield 8. Thus, it is necessary to accurately define the fixed scanning position θ5 during the pulling and improve the irradiation accuracy of the laser beam 10. With respect to this point, according to the present embodiment, since the edge position θc can be sought accurately, it is possible to accurately define the fixed scanning position θ5 during the pulling based on the edge position θc, and thereby accurately irradiating the laser beam 101 onto the target position of the upper surface 8b of the rim 8a of the thermal shield 8 upon accurately defining the irradiation direction of the laser beam 101. Consequently, even with the third distance measuring method shown in FIG. 10 where the laser beam 101 must be irradiated onto an extremely narrow side surface 8d of the rim 8a of the thermal shield 8, the laser beam 101 can be accurately irradiated onto the target position, and the third distance measurement shown in FIG. 10 can be conducted easily.

In addition, according to the present embodiment, distance measurement for each short interval Δθ2 is conducted in a short section, which is from the scanning start position θrs where a position is returned a predetermined amount φ (20 pulses), up to a position that the count reaches the predetermined amount (40 pulses). And otherwise, as a general rule, the distance measurement is conducted for each long interval Δθ1 and the processing is performed at high speed. Thus, the position measurement processing can be completed in a short period of time and the operation can be performed with high efficiency.

The respective processing steps in the foregoing embodiment may be changed or deleted to the extent that it does not change the gist of the present invention.

Foremost, in the foregoing embodiment, although the laser beam 101 is used to perform scanning in the direction A from the silicon single crystal 10 side toward the thermal shield 8 so as to determine whether the measured distance d changes from a size corresponding to the distance da between the reference point and the melt 5 to a size corresponding to the distance db between the reference point and the rim 8a of the thermal shield 8 (respective determination processing steps of step 205, step 208, step 212, and step 216), the same determination may be conducted by scanning the laser beam 101 in the direction B from the thermal shield 8 side toward the silicon single crystal 10.

Specifically, it is also possible to scan the laser beam 101 in the direction B from the thermal shield 8 side toward the silicon single crystal 10 and, in the respective determination processing steps of step 205, step 208, step 212, and step 216, determine whether the measured distance d changes from a size corresponding to the distance db between the reference point and the rim 8a of the thermal shield 8 to a size corresponding to the distance da between the reference point and the melt 5. In the foregoing case, at step 210, the processing of returning the optical scanning position θ a predetermined amount φ in the opposite direction A of the scanning direction B is performed, and then the processing routine enters a stage of conducting a detailed search regarding whether the laser beam scanning position θ reaches the edge 8e of the thermal shield 8 at a cycle Δθ2 that is shorter than the scanning interval Δθ1 (steps 211 to 214).

Moreover, in the foregoing embodiment in the stage of conducting a detailed search regarding whether the laser beam scanning position θ reaches the edge 8e of the thermal shield 8 (steps 211 to 214), the distance d is measured each time the stepping motor 122 is moved a minimal step (1 step) in order to determine whether the laser beam scanning position θ reaches the edge 8e of the thermal shield 8 at a cycle Δθ2 that is shorter than the scanning interval Δθ1. Nevertheless, performing the distance measurement and the determination processing each time the stepping motor 122 is moved a minimal step (1 step) is merely one example, and, so as long as the distance measurement and the determination processing can be performed at an interval that is shorter than Δθ1, the stepping motor 122 may perform the distance measurement and the determination processing for each interval of 2 steps or more.

In the foregoing embodiment, after the determination processing (step 205) of determining whether the position reaches the edge 8e of the thermal shield 8, the processing routine enters a stage of confirming whether the laser beam scanning position θ reaches the edge 8e of the thermal shield 8 (steps 207, 208, 209, 225, 226) and, if it is consequently determined that the laser beam scanning position θ is the "tentative edge position" (step 209; determination of YES), the scanning position θ is returned a predetermined amount φ in the opposite direction B of the scanning direction A (step 210). Nevertheless, in the foregoing case, it is also possible to omit the processing of the stage of confirming whether the laser beam scanning position θ reaches the edge 8e of the thermal shield 8 (steps 207, 208, 209, 225, 226), and, if it is determined that the position reaches the edge 8e of the thermal shield 8 as a result of the determination processing (step 205) of determining whether the position reaches the edge 8e of the thermal shield 8 (step 205; determination of YES), then the processing routine may proceed to the processing (step 210) of defining such point in time as the "tentative edge position," and returning the position in the opposite direction B of the scanning direction A for a predetermined amount φ.

Moreover, in the foregoing embodiment, after the processing (step 210) of returning the optical scanning position θ a predetermined amount φ in the opposite direction B of the scanning direction A, the processing routine enters the stage of conducting a detailed search regarding whether the laser beam scanning position θ reached the edge 8e of the thermal shield 8 at a cycle Δθ2 that is shorter than the scanning interval Δθ1 (steps 211 to 214), and, as a result, if it is determined that the laser beam scanning position θ reaches the edge 8e of the thermal shield 8 (step 212; determination of YES), the processing routine enters the stage of confirming whether the laser beam scanning position θ reaches the edge 8e of the thermal shield 8 (step 215, 216, 217, 218, 219, 220) in order to determine the final edge position (step 217). Nevertheless, in the foregoing case, it is also possible to omit the stage of confirming whether the laser beam scanning position θ reaches the edge 8e of the thermal shield 8 (step 215, 216, 217, 218, 219, 220), and, the processing routine may enter the stage of conducting a detailed search regarding whether the laser beam scanning position θ reached the edge 8e of the thermal shield 8 at a cycle Δθ2 that is shorter than the scanning interval Δθ1 (steps 211 to 214) after the processing (step 210) of returning the optical scanning position θ a predetermined amount φ in the opposite direction B of the scanning direction A, and, as a result, if it is determined that the laser beam scanning position θ reaches the edge 8e of the thermal shield 8 (step 212; determination of YES), the scanning position θ at such point in time may be determined to be the final edge position (step 217).

Moreover, it is also possible to omit the processing of steps 211 to 214, and, after the processing (step 210) of returning the optical scanning position θ a predetermined amount φ in the opposite direction B of the scanning direction A, the processing routine may enter the stage of confirming whether the laser beam scanning position θ reaches the edge 8e of the thermal shield 8 (step 215 onward) to determine the final edge position (step 217). In the foregoing case, the processing of step 219 is omitted.

In other words, as the present invention, any mode of algorithm may be employed within the scope of that invention, as long as the first determination processing is performed while the distance measurement is conducted at a first scanning interval Δθ1; if it is consequently determined that the measured distance d that is judged to be the edge position changes, the optical scanning position θ is thereafter returned a predetermined amount φ in the opposite direction B of the scanning direction A (or in the opposite direction A of the scanning direction B); the second determination processing is performed while the laser beam 101 is re-scanned from the returned optical scanning position θrs and the distance measurement is conducted at a second scanning interval Δθ2 that is shorter than the first scanning interval Δθ1; if it is consequently determined that the measured distance d that is judged to be the edge position changes; and, whereby it is possible to ultimately determine that the laser beam 101 reflects off the edge 8e of the rim 8a of the thermal shield 8 at the optical scanning position θc at the point in time that the change is determined.

Moreover, the foregoing embodiment assumes a case of defining the scanning positions θ1 to θ6 in order to measure the edge position θc and to conduct the distance measurement based on such edge position θc. Nevertheless, this is merely one example, and other measurements may be conducted based on the edge θc. For example, it is also possible to scan the laser beam 101 in the direction B from the edge position θc toward the silicon single crystal 10 side, determine that the laser beam 101 reaches the silicon single crystal 10 at the point in time that the light reception output changes, and thereby measuring the distance from the edge 8e to the silicon single crystal 10, that is, the thermal shield/silicon single crystal distance D. According to this embodiment, since it is possible to measure the edge position θc with extreme precision, the shield/silicon single crystal distance D to be measured based on the edge position θc can also be sought with extremely accuracy.

Incidentally, although the foregoing embodiment is explained by assuming a case where a silicon single crystal is manufactured as the semiconductor single crystal, the present invention can similarly be applied to cases of manufacturing a compound semiconductor of gallium arsenide or the like. In addition, although the foregoing embodiment is explained by assuming a case where the silicon single crystal 10 is pulled with the Magnetic Field Applied Czochralski Method (MCZ method), the present invention can also be applied to cases of pulling the silicon single crystal 10 without applying a magnetic field as a matter of course.

Figure 1:
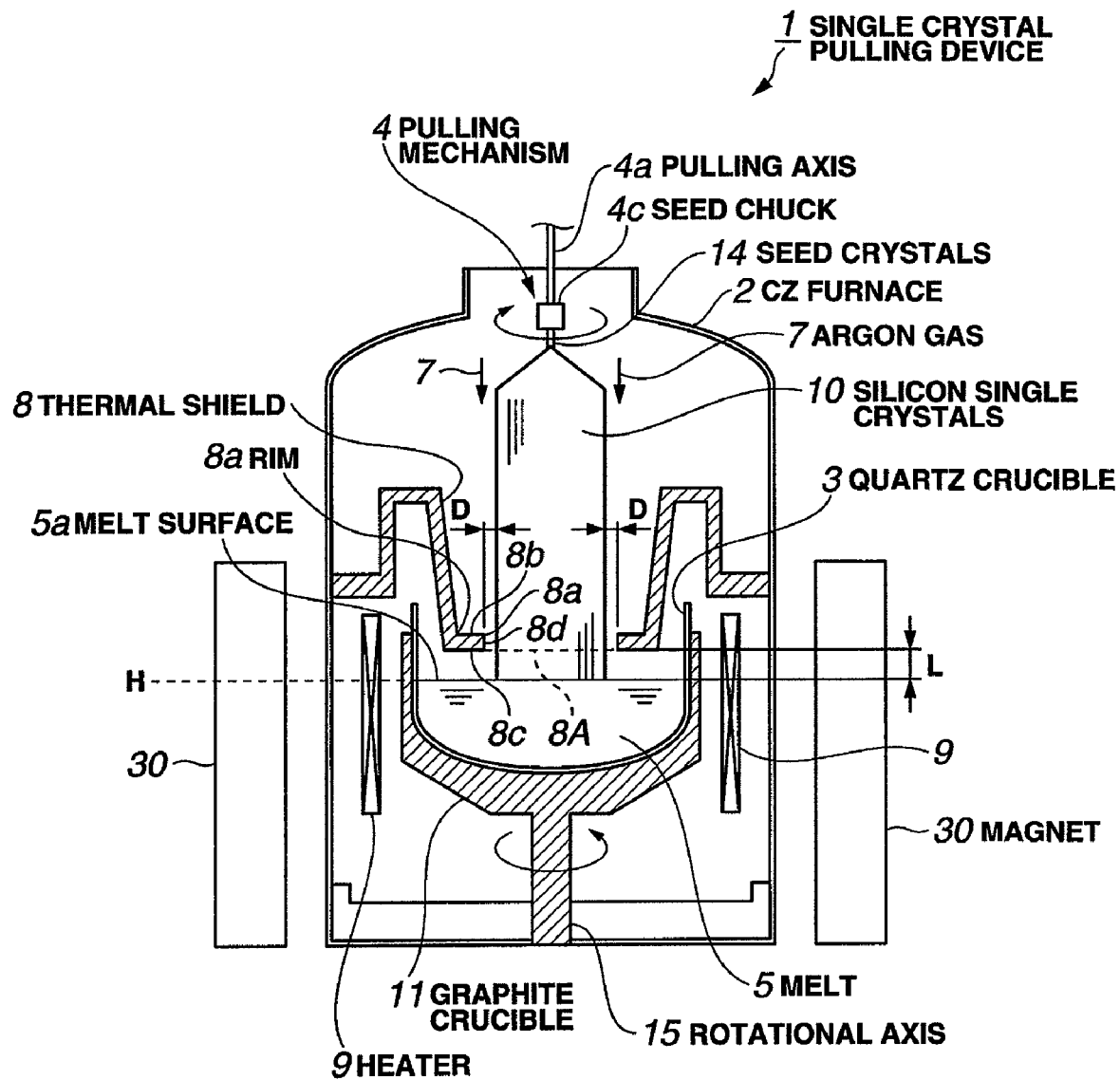
FIG. 1 is a diagram showing a configuration example of a silicon single crystal manufacturing device.
Figure 2:
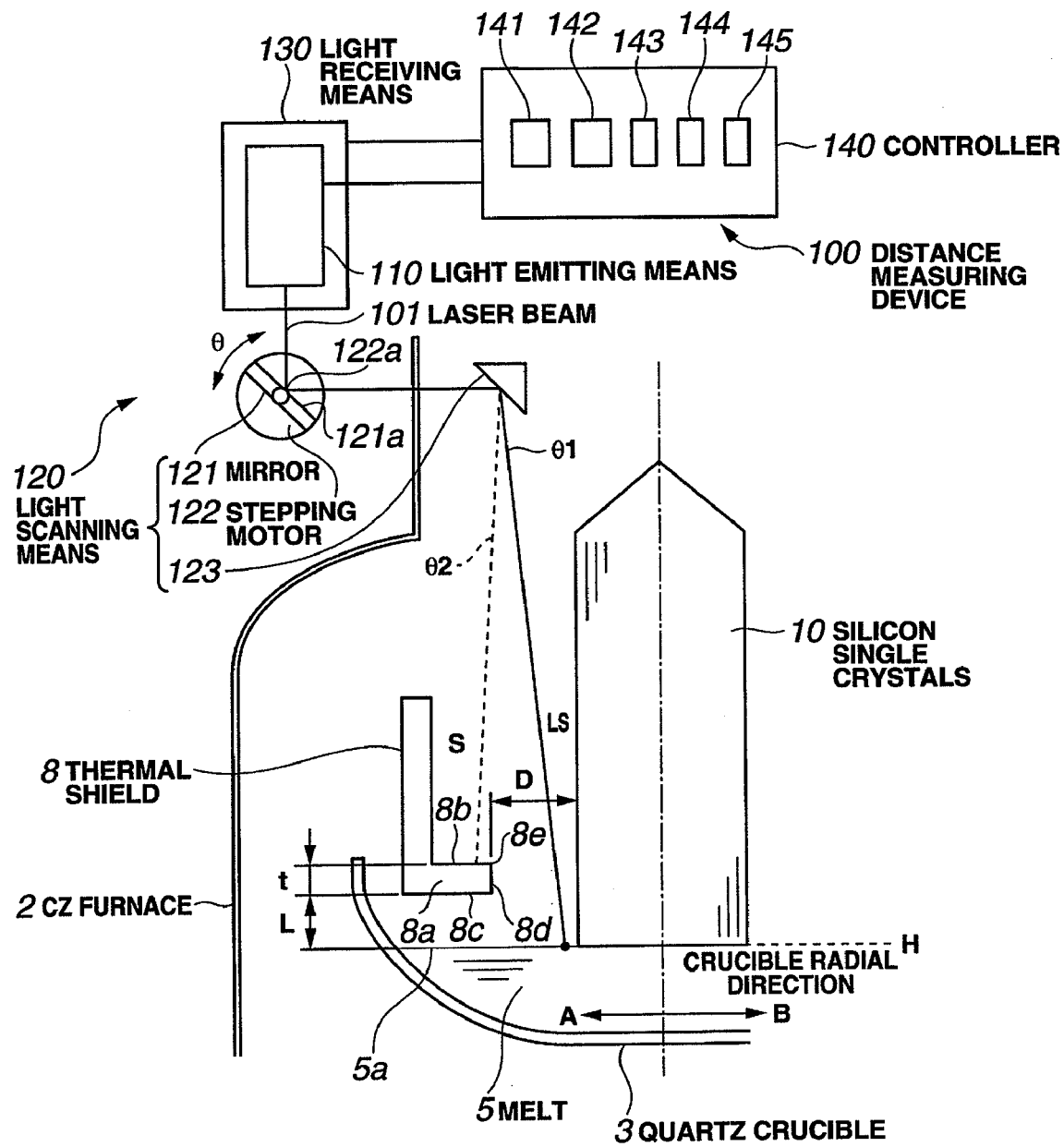
FIG. 2 is a diagram showing a configuration example of a distance measuring device according to a first distance measuring method.
Figure 3:
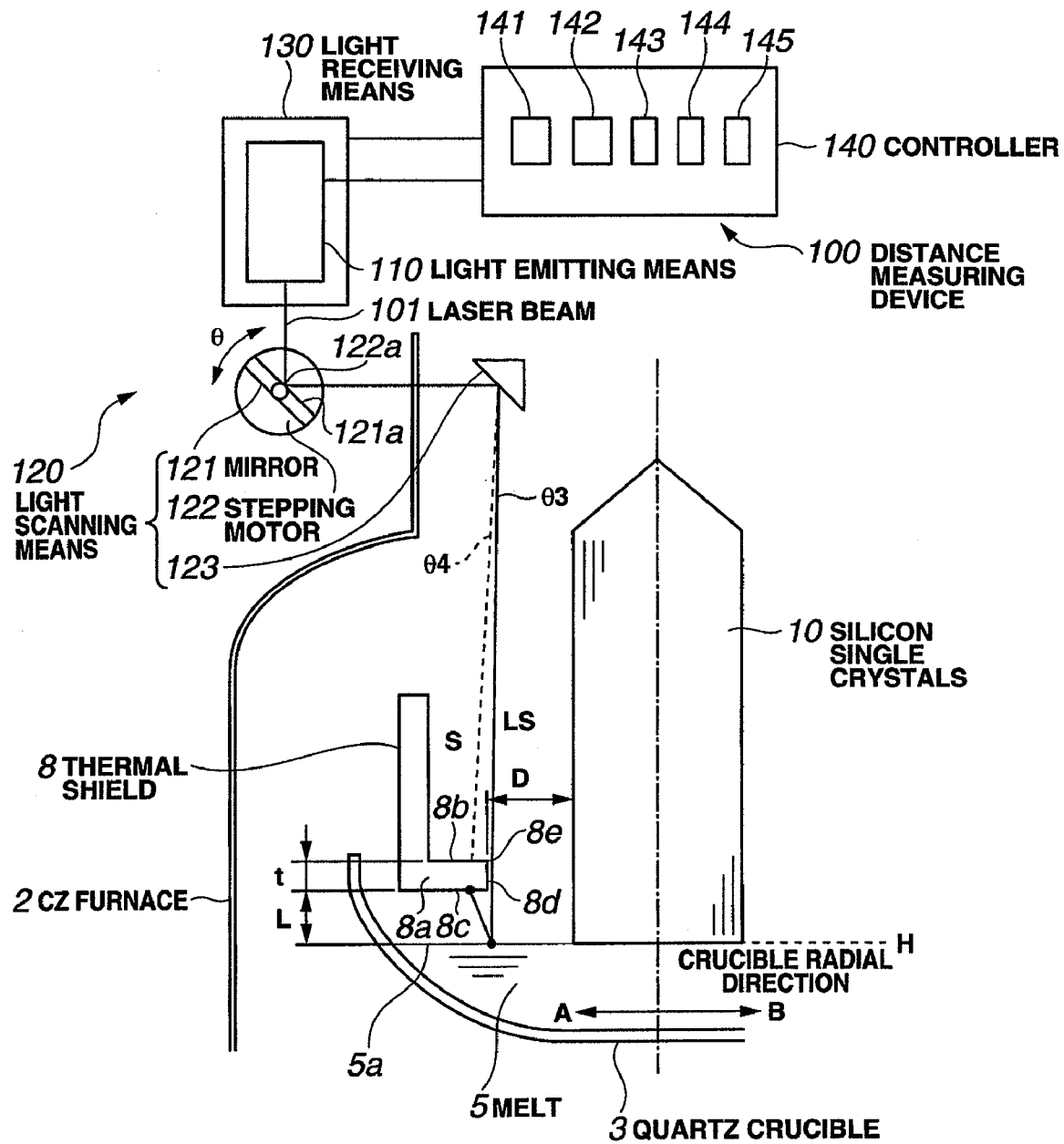
FIG. 3 is a diagram showing a configuration example of a distance measuring device according to a second distance measuring method.
Figure 4:
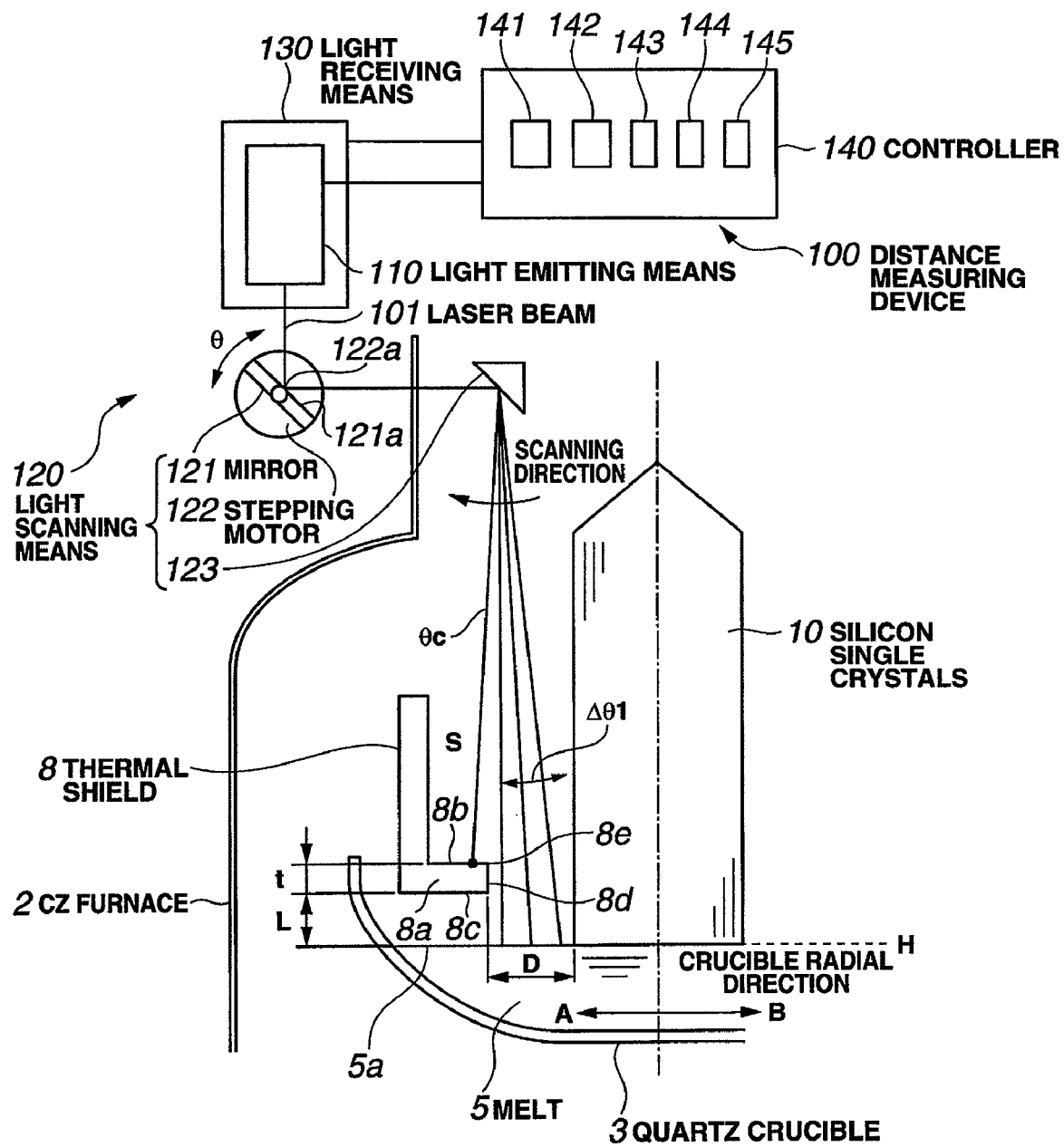
FIG. 4 is a diagram explaining a conventional position measuring principle.
Figure 5A:
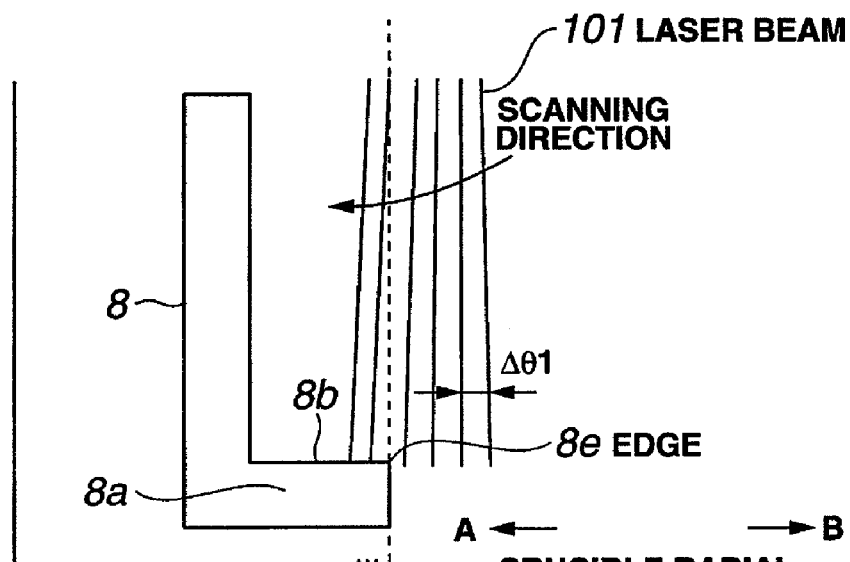
FIG. 5A and FIG. 5B are diagrams explaining a conventional position measuring algorithm.
Figure 5B:
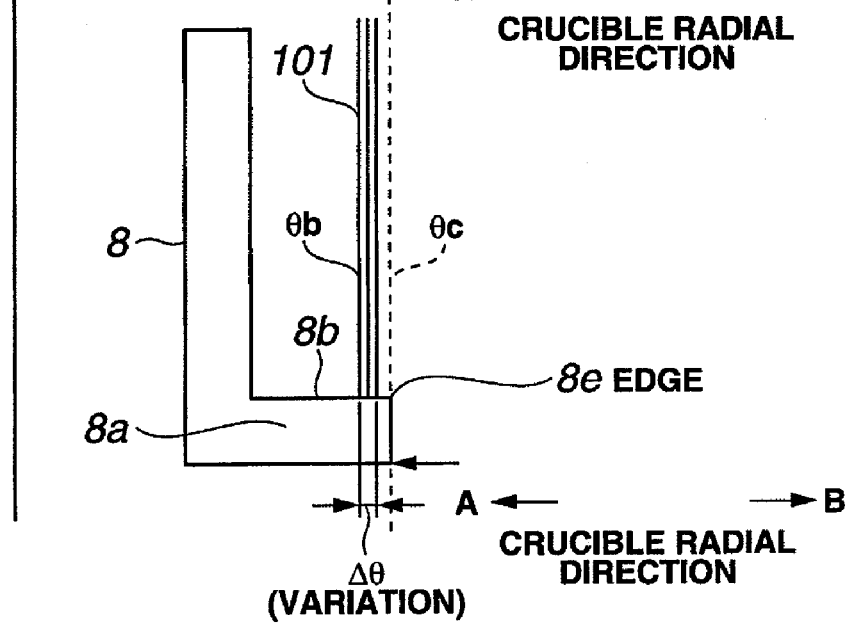
Figure 6A:
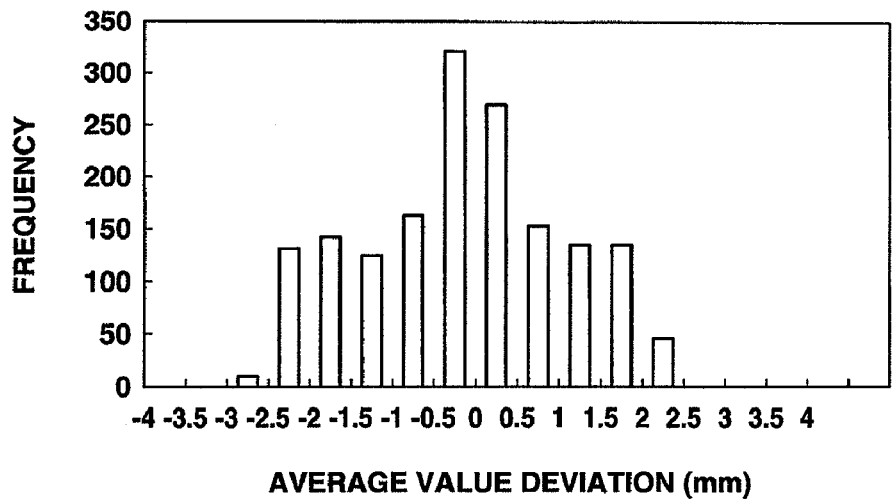
FIG. 6A and FIG. 6B are diagrams showing a histogram of distance measurement of conventional technology and a histogram of an embodiment of the present invention, respectively.
Figure 6B:
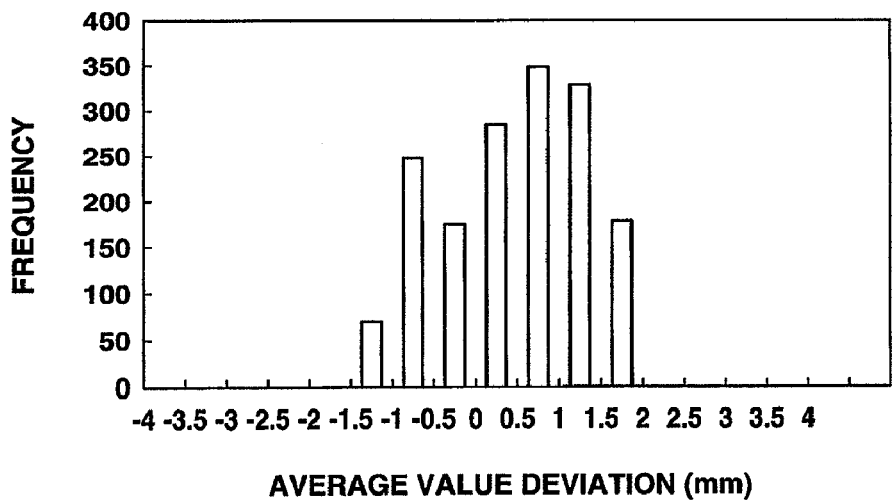
Figure 7:
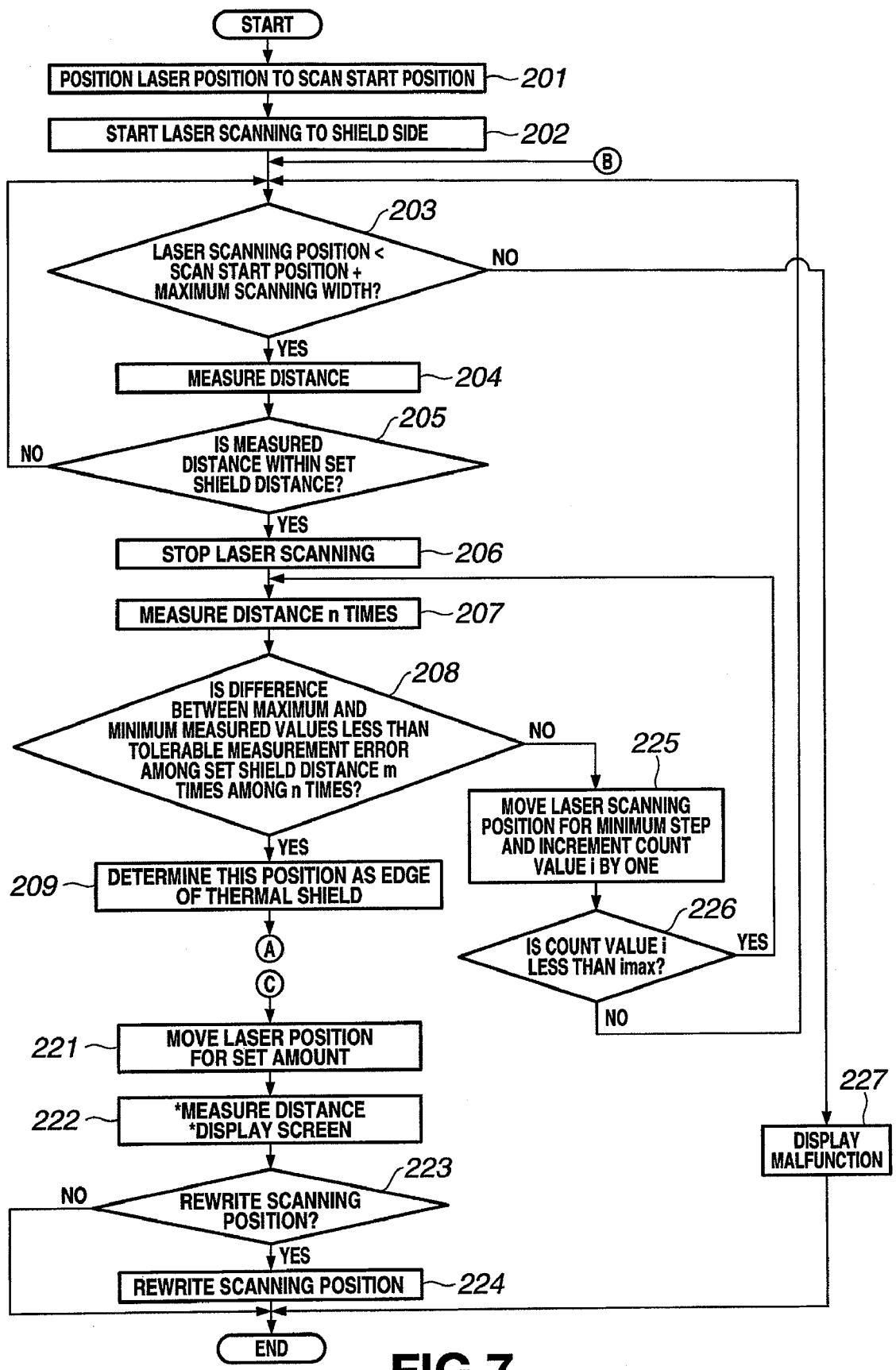
FIG. 7 is a position measuring algorithm according to an embodiment of the present invention.
Figure 8:
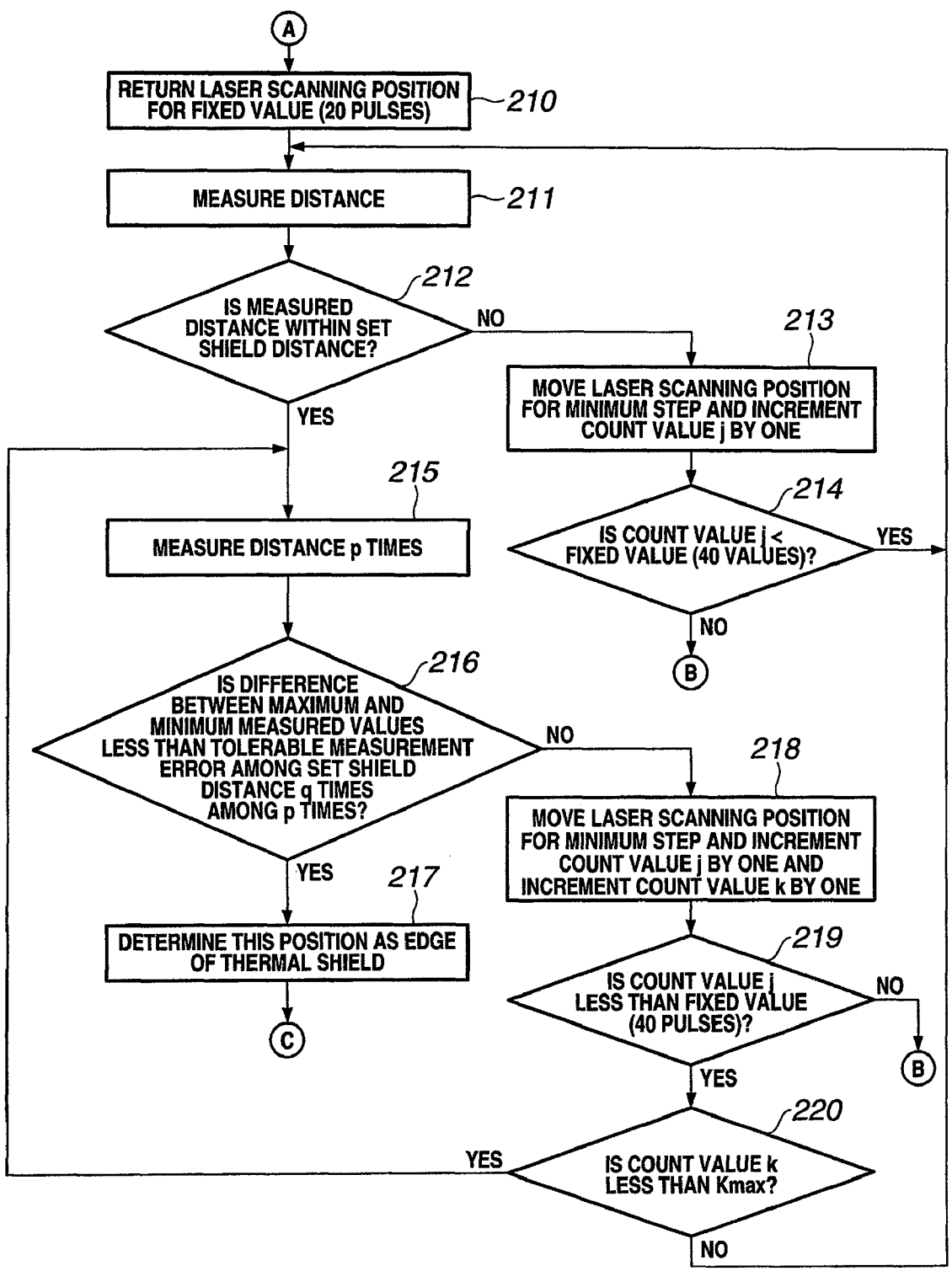
FIG. 8 is a position measuring algorithm according to an embodiment of the present invention.
Figure 9A:
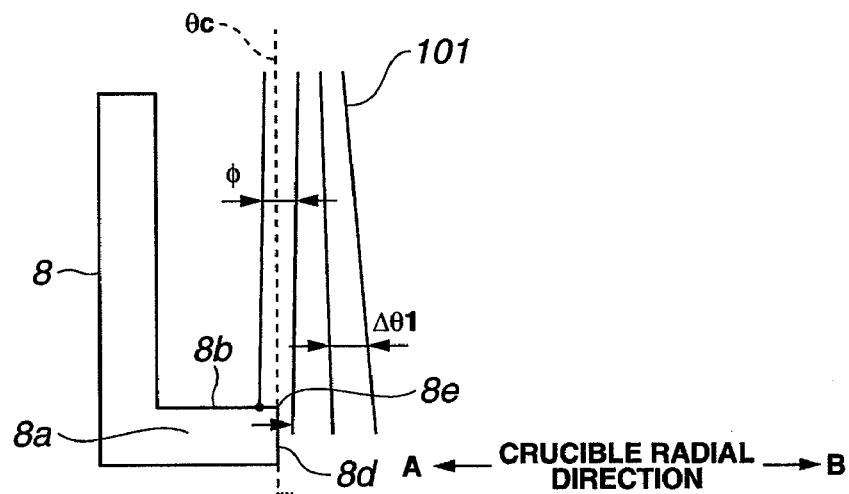
FIG. 9A, FIG. 9B, and FIG. 9C are diagrams explaining the processing contents of FIG. 7 and FIG. 8.
Figure 9B:
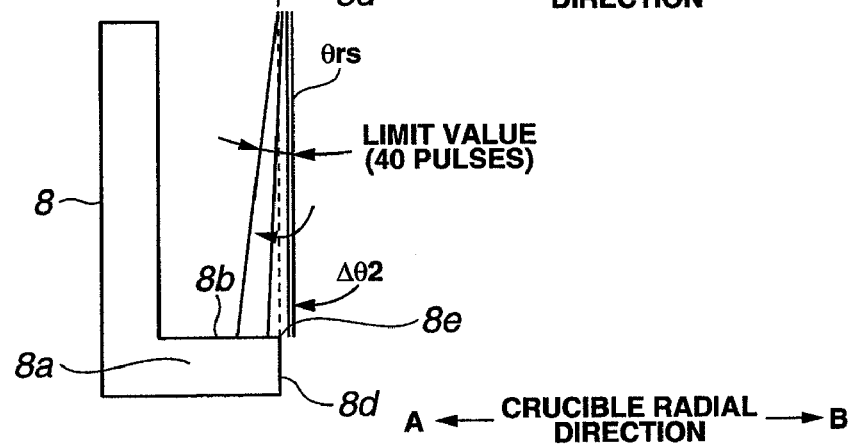
Figure 9C:
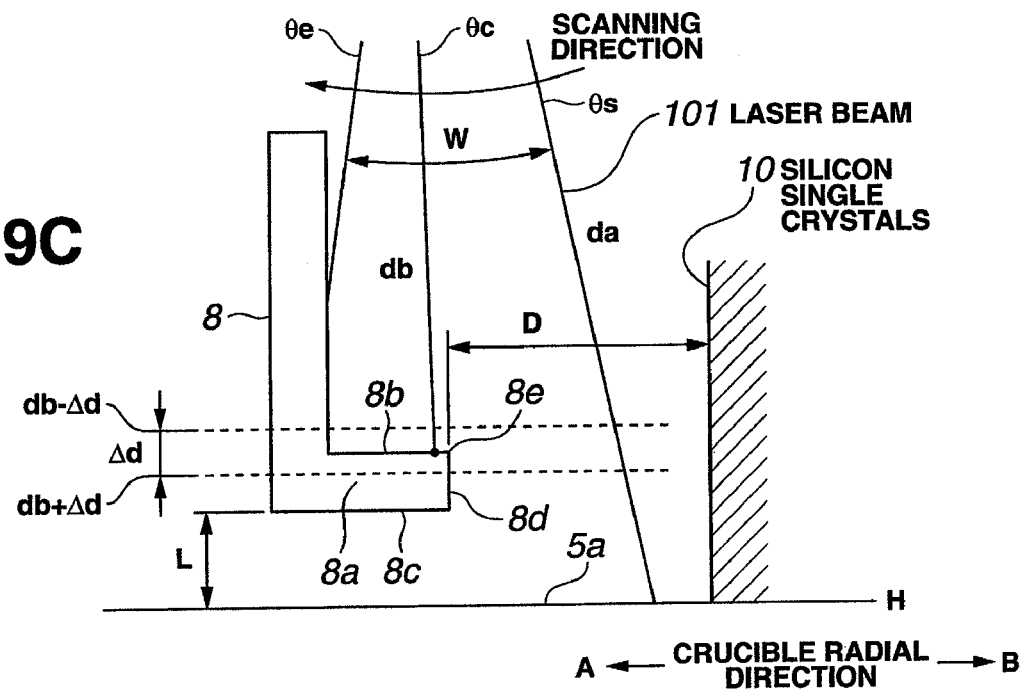
Figure 10:
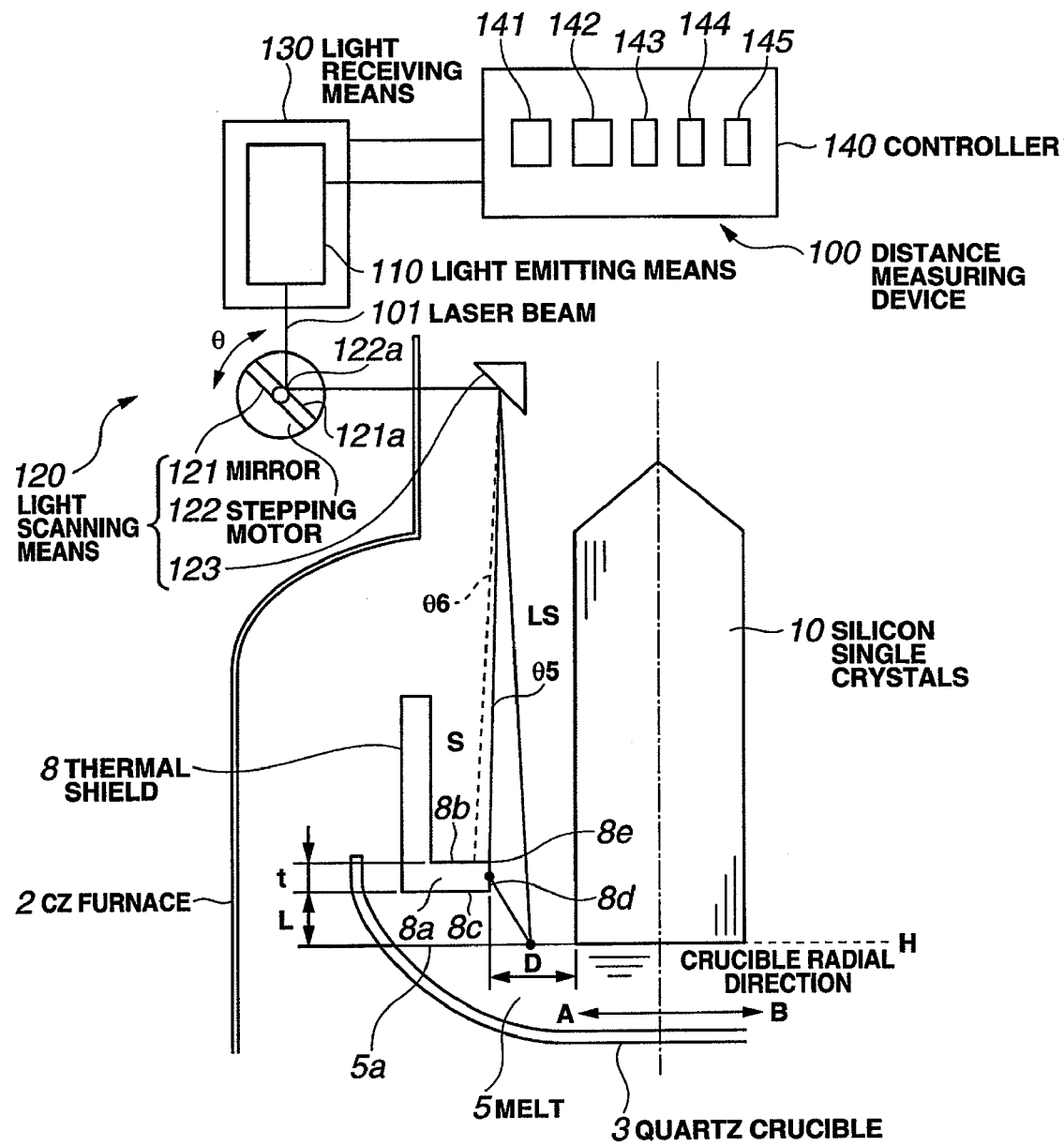
FIG. 10 is a diagram showing a configuration example of a distance measuring device according to a third distance measuring method.

The invention claimed is:

1. A position measuring device applied to a semiconductor single crystal manufacturing device for manufacturing a semiconductor single crystal by pulling up and growing the semiconductor single crystal from a melt housed in a crucible of a furnace, comprising:
   a thermal shield located above the melt and provided around the semiconductor single crystal, and having a rim at a lower end thereof;
   light emitting means for emitting light;
   light scanning means for performing scanning of the light emitted from the light emitting means along a radial direction of the crucible;
   light receiving means for receiving reflected light of the light emitted from the light emitting means and used to perform scanning by the light scanning means;
   first distance measuring means for sequentially measuring a distance between a reference point and a reflection point for each prescribed first scanning interval based on a sequential optical scanning position, an emitting position of the light emitting means, and a light receiving position of the light receiving means and according to a principle of triangulation while performing light scanning;
   first determination means for determining whether the distance measured by the first distance measuring means changes from a size corresponding to a distance between the reference point and the melt to a size corresponding to a distance between the reference point and the rim of the thermal shield, or changes from the size corresponding to the distance between the reference point and the rim of the thermal shield to the size corresponding to the distance between the reference point and the melt;
   second distance measuring means for sequentially measuring, when the first determination means determines that the measured distance changes, a distance between the reference point and a reflection point for each second scanning interval that is shorter than the first scanning interval, based on a sequential optical scanning position, an emitting position of the light emitting means, and a light receiving position of the light receiving means and according to the principle of triangulation while returning the optical scanning position for a predetermined amount in a direction opposite to the scanning direction and performing re-scanning of the light from the returned optical scanning position;
   second determination means for determining whether the distance measured by the second distance measuring means changes from the size corresponding to the distance between the reference point and the melt to the size corresponding to the distance between the reference point and the rim of the thermal shield, or changes from the size corresponding to the distance between the reference point and the rim of the thermal shield to the size corresponding to the distance between the reference point and the melt; and
   edge position judgment means for judging, when the second determination means determines that the measured distance changes, that light is reflected by an edge of the rim of the thermal shield at the optical scanning position at a point in time when the change is determined.

2. The position measuring device applied to a semiconductor single crystal manufacturing device according to claim 1 for manufacturing a semiconductor single crystal while measuring a distance between a thermal shield and a melt or/and a liquid level of the melt during pulling of the semiconductor single crystal and performing control so that the measurement becomes a desired value, further comprising:
   pulling distance measuring means for fixing as the pulling position the position in the direction of scanning light during the pulling of the semiconductor single crystal, and measuring the distance between the thermal shield and the melt or/and the liquid level of the melt based on the fixed scanning position during the pulling, the emitting position of the light emitting means, and the light receiving position of the light receiving means and according to the principle of triangulation,
   wherein the fixed scanning position during the pulling is defined based on the optical scanning position at a point in time when the edge position judgment means judges that light is reflected by the edge of the rim of the thermal shield.

3. The position measuring device applied to a semiconductor single crystal manufacturing device according to claim 2,
   wherein the fixed scanning position during the pulling is defined so that light traces a path of reflecting off the liquid level of the melt and a side surface of the rim of the thermal shield, respectively.

4. The position measuring device applied to a semiconductor single crystal manufacturing device according to claim 1,
   wherein the light scanning means includes a mirror for reflecting the light emitted from the light emitting means, and an actuator for changing an attitude angle of a light reflecting surface of the mirror, and performs scanning of light by driving the actuator and changing the attitude angle of the light reflecting surface of the mirror.

5. The position measuring device applied to a semiconductor single crystal manufacturing device according to claim 1 or claim 4,
   wherein the light scanning means performs light scanning by using a stepping motor as the actuator, and
   the second distance measuring means measures the distance between the reference point and the reflection point each time the stepping motor makes one step rotation.

6. A position measuring method applied to a semiconductor single crystal manufacturing device for manufacturing a semiconductor single crystal by pulling up and growing the semiconductor single crystal from a melt housed in a crucible in a furnace, the method implementing position measurement processing comprising:

a first distance measuring step of sequentially measuring a distance between a reference point and a reflection point of light for each prescribed first scanning interval based on a sequential optical scanning position, an emitting position of light, and a light receiving position of light and according to a principle of triangulation while performing scanning of the light along a radial direction of the crucible;

a first determination step of determining whether the distance measured in the first distance measuring step changes from a size corresponding to a distance between the reference point and the melt to a size corresponding to a distance between the reference point and a rim of a thermal shield, or changes from the size corresponding to the distance between the reference point and the rim of the thermal shield to the size corresponding to the distance between the reference point and the melt;

a second distance measuring step of sequentially measuring, when determination is made that the measured distance changes in the first determination step, a distance between the reference point and a reflection point for each second scanning interval that is shorter than the first scanning interval based on a sequential optical scanning position, an emitting position of the light, and a light receiving position and according to the principle of triangulation while returning the optical scanning position for a predetermined amount in a direction opposite to the scanning direction and performing re-scanning of light from the returned optical scanning position;

a second determination step of determining whether the distance measured in the second distance measuring step changes from the size corresponding to the distance between the reference point and the melt to the size corresponding to the distance between the reference point and the rim of the thermal shield, or changes from the size corresponding to the distance between the reference point and the rim of the thermal shield to the size corresponding to the distance between the reference point and the melt; and an edge position judgment step of judging, when determination is made that the measured distance changes in the second determination step, that light reflected by an edge of the rim of the thermal shield at the optical scanning position at a point in time that the change is determined.

7. The position measuring method applied to a semiconductor single crystal manufacturing device according to claim 6 for manufacturing a semiconductor single crystal while measuring a distance between a thermal shield and a melt or/and a liquid level of the melt during pulling of the semiconductor single crystal and performing control so that the measurement becomes a desired value, further including:

a step of defining a position of a direction of scanning light during the pulling based on an optical scanning position at a point in time when determination is made in the edge position judgment step that light is reflected by the edge of the rim of the thermal shield; and a pulling distance measuring step of fixing the position of the direction of scanning light during the pulling of the semiconductor single crystal, and measuring the distance between the thermal shield and the melt or/and the liquid level of the melt based on the fixed scanning position during the pulling, the emitting position of light emitting means, and the light receiving position of light receiving means and according to the principle of triangulation.

8. The position measuring method applied to a semiconductor single crystal manufacturing device according to claim 7, wherein the fixed scanning position during the pulling is defined so that light traces a path of reflecting off the liquid level of the melt and the side surface of the rim of the thermal shield, respectively.

\* \* \* \* \*